United States Patent
Tanzawa et al.

[19]

[11] Patent Number: 6,154,403
[45] Date of Patent: Nov. 28, 2000

[54] SEMICONDUCTOR MEMORY DEVICE

[75] Inventors: Toru Tanzawa, Ebina; Tomoharu Tanaka, Yokohama, both of Japan

[73] Assignee: Kabushiki Kaisha Toshiba, Kawasaki, Japan

[21] Appl. No.: 09/512,469

[22] Filed: Feb. 24, 2000

Related U.S. Application Data

[62] Division of application No. 08/843,721, Apr. 17, 1997, Pat. No. 6,072,719.

[30] Foreign Application Priority Data

Apr. 19, 1996 [JP] Japan ................................. 8-098421
Apr. 19, 1996 [JP] Japan ................................. 8-098852

[51] Int. Cl.$^7$ .............................................. G11C 7/00
[52] U.S. Cl. ................................. 365/203; 365/201
[58] Field of Search .................................. 365/203, 201, 365/185.09, 185.23, 189.05

[56] References Cited

U.S. PATENT DOCUMENTS

| | | | |
|---|---|---|---|
| 4,543,647 | 9/1985 | Yoshida | 365/185.18 |
| 5,163,021 | 11/1992 | Mehrotra et al. | 365/185.03 |
| 5,272,669 | 12/1993 | Samachisa et al. | 365/185.03 |
| 5,331,594 | 7/1994 | Hotta | 365/200 |
| 5,339,277 | 8/1994 | McClure | 365/201 |
| 5,341,336 | 8/1994 | McClure | 365/201 |
| 5,400,342 | 3/1995 | Matsumura et al. | 365/201 |
| 5,495,442 | 2/1996 | Cernea et al. | 365/185.03 |
| 5,502,675 | 3/1996 | Kohno et al. | 365/189.02 |
| 5,550,772 | 8/1996 | Gill | 365/185.03 |
| 5,557,567 | 9/1996 | Bergemont et al. | 365/185.03 |
| 5,583,812 | 12/1996 | Harari | 365/815.03 |
| 5,615,153 | 3/1997 | Yiu et al. | 365/185.03 |
| 5,644,542 | 7/1997 | McClure et al. | 365/201 |
| 5,652,719 | 7/1997 | Tanaka et al. | 365/185.03 |
| 5,677,869 | 10/1997 | Fazio et al. | 365/185.03 |
| 5,745,420 | 4/1998 | McClure | 365/201 |
| 5,753,950 | 5/1998 | Kojima | 365/185.01 |
| 5,754,469 | 5/1998 | Hung et al. | 365/185.03 |

OTHER PUBLICATIONS

*ISSCC Digest of Technical Papers*, pp. 132–133; M. Bauer, et al.; Feb. 1995.
*ISSCC Digest of Technical Papers*, pp. 32–33; T.S. Jung, et al; Feb. 1996.

*Primary Examiner*—Tan T. Nguyen
*Attorney, Agent, or Firm*—Banner & Witcoff, Ltd.

[57] ABSTRACT

A semiconductor memory device comprises a memory cell array with a plurality of blocks having a plurality of memory cells arranged in a matrix, a plurality of address latch circuits provided so as to correspond to the blocks, a row decoder that accesses the memory cell array in blocks according to the latched state of the plurality of address latch circuits, and a control circuit for accessing the memory cell array by latching all of the blocks to the selected state and then canceling the address latching of the selected block to the unselected state.

14 Claims, 34 Drawing Sheets

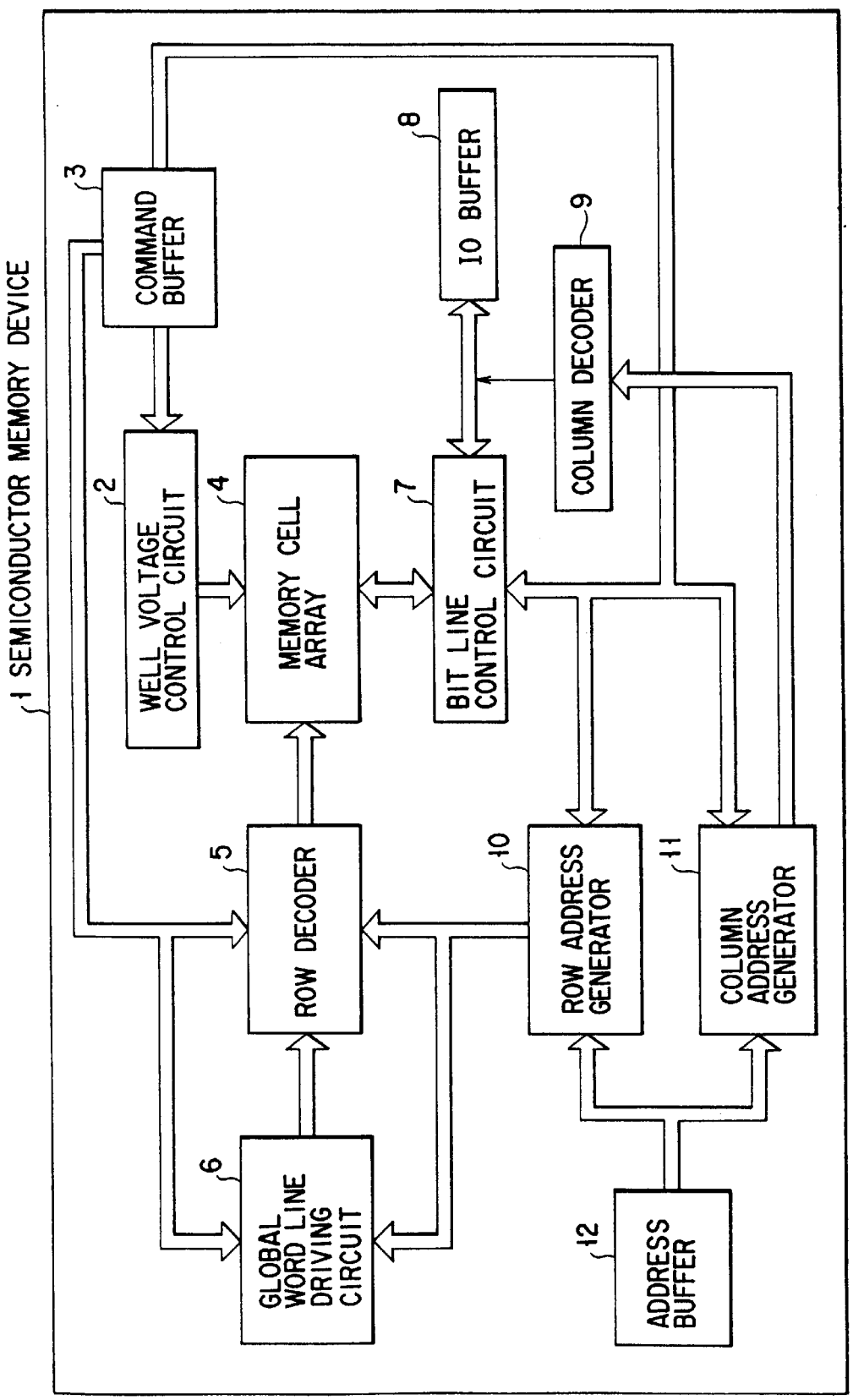
F I G. 1

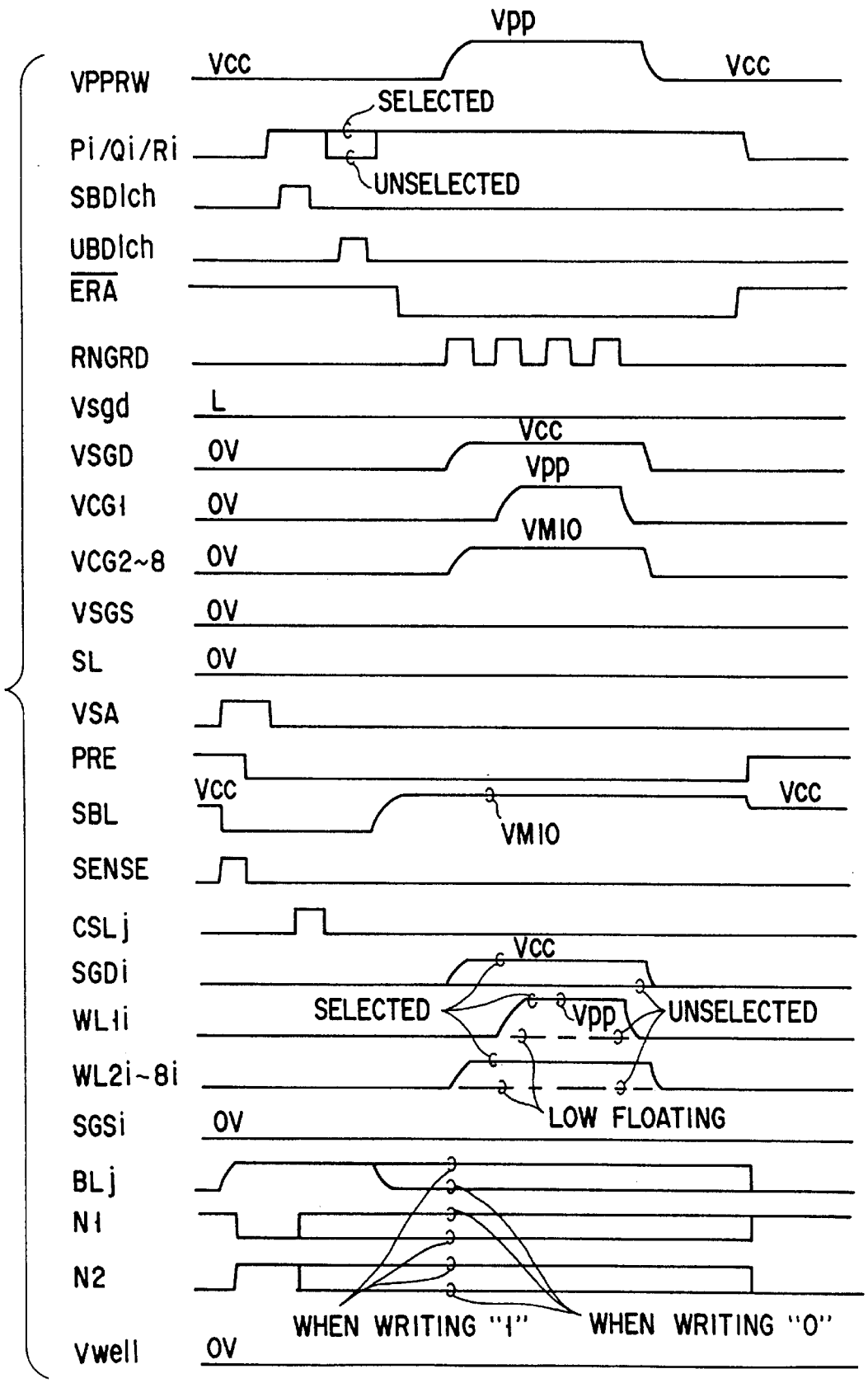
F I G. 6

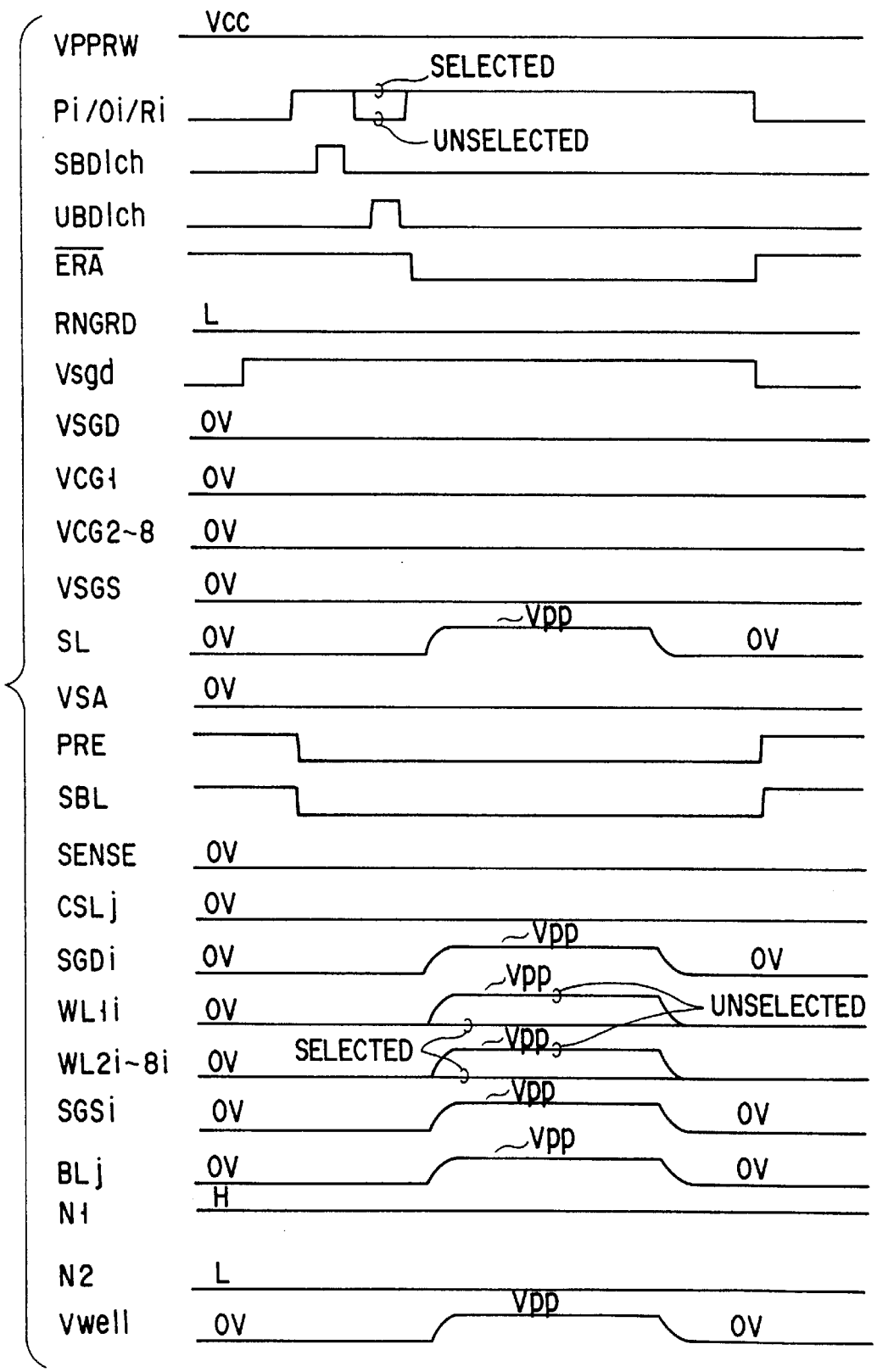
F I G. 7

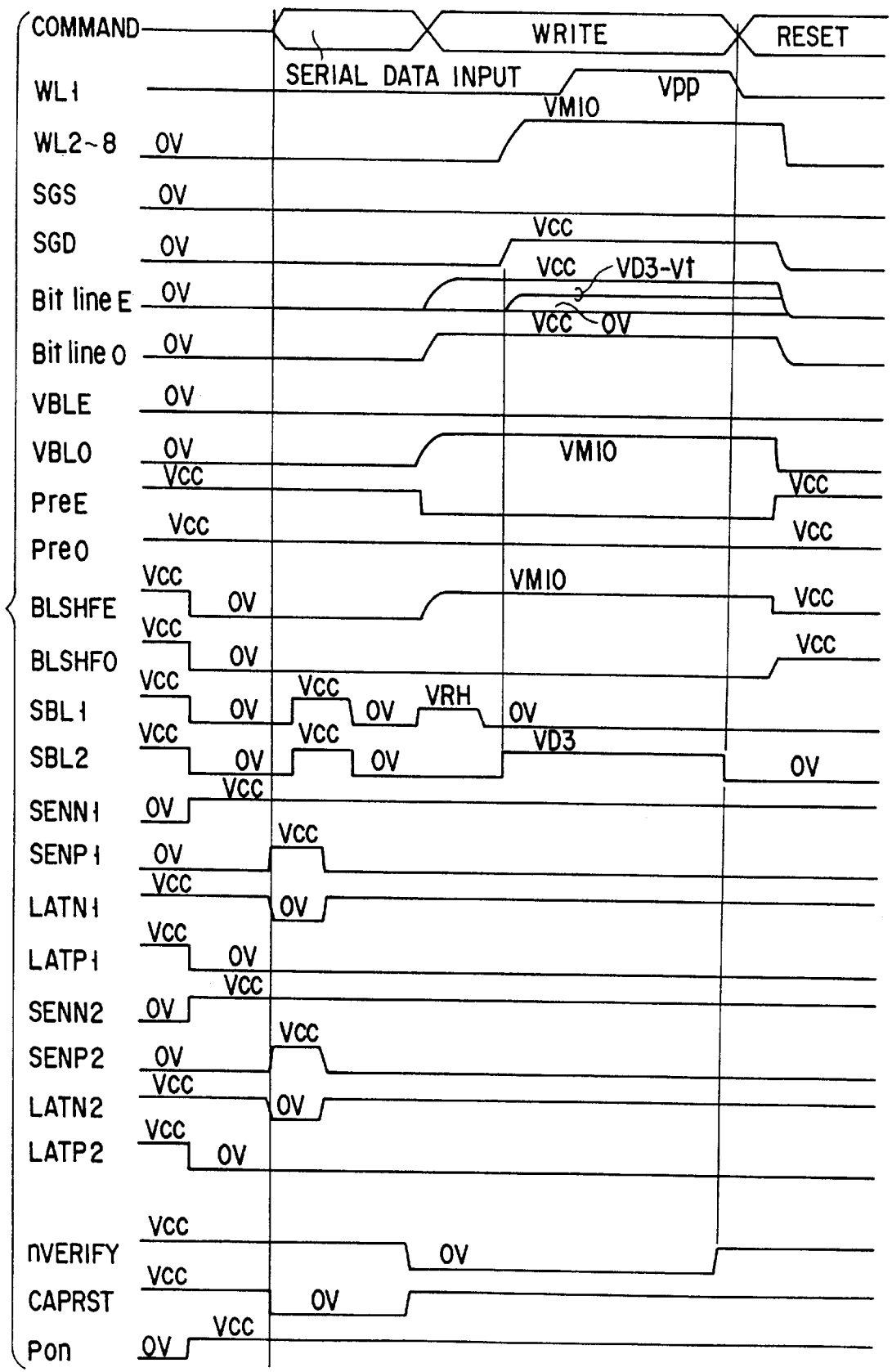
F I G. 19

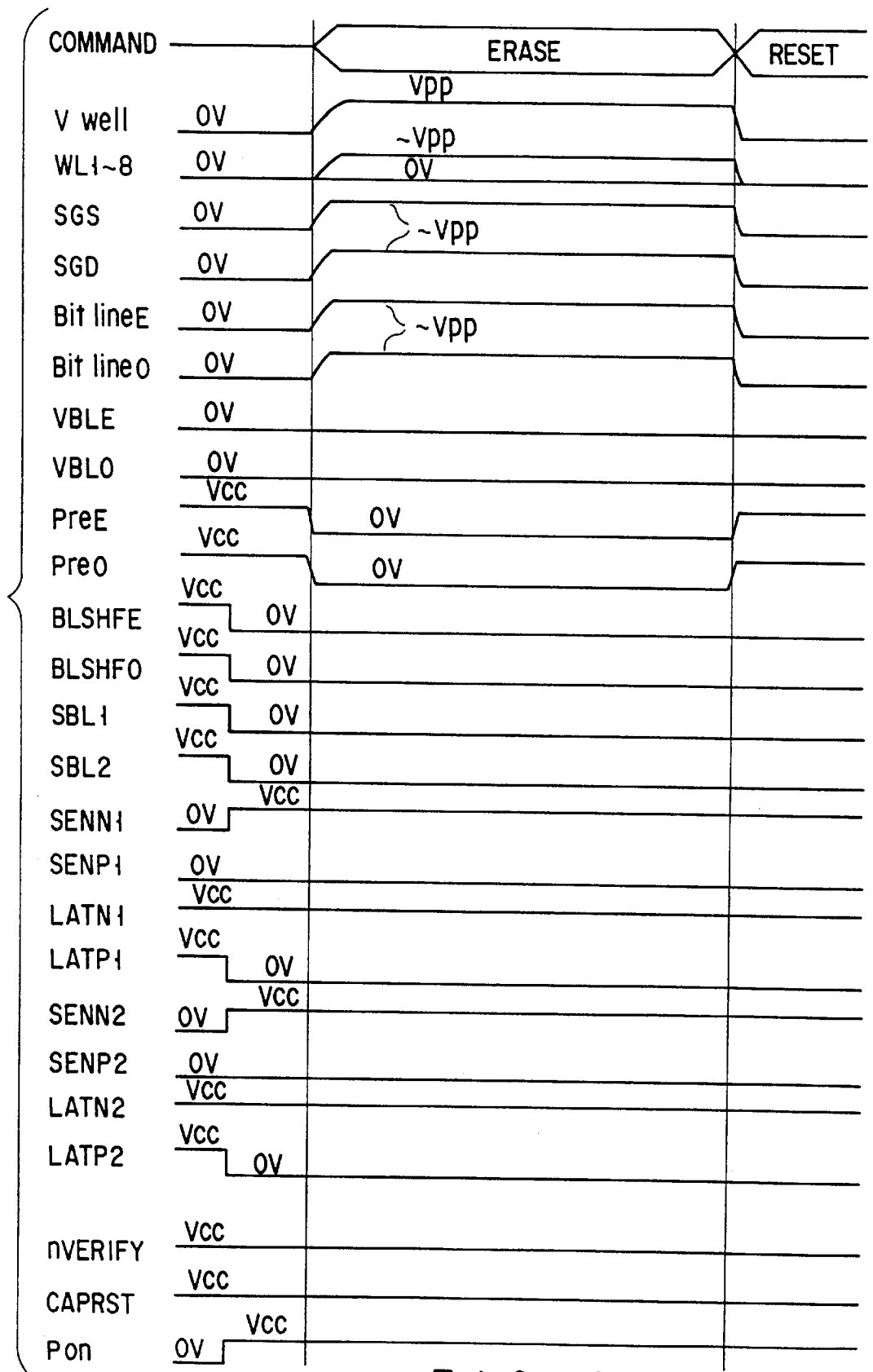
F I G. 20

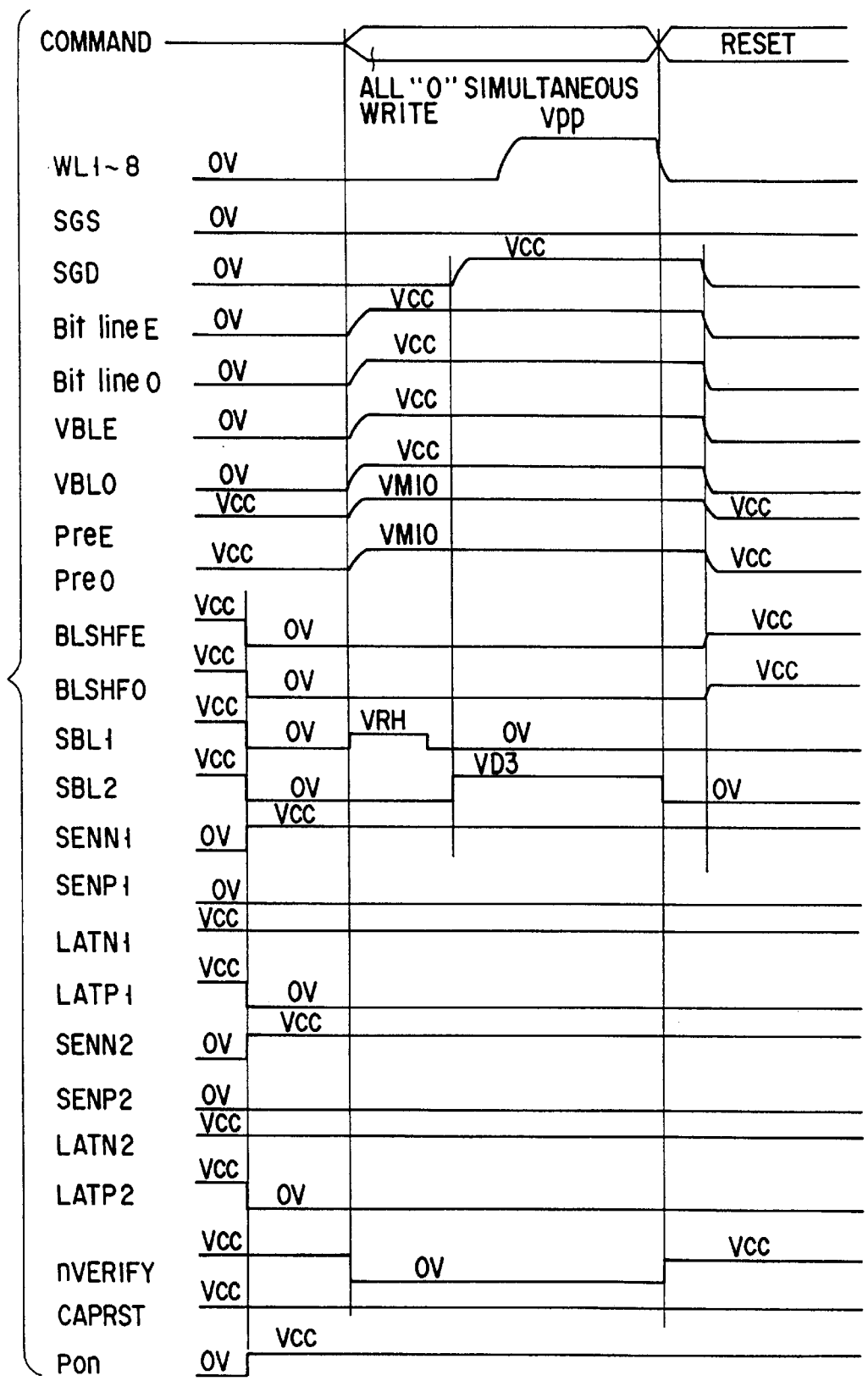
F I G. 23

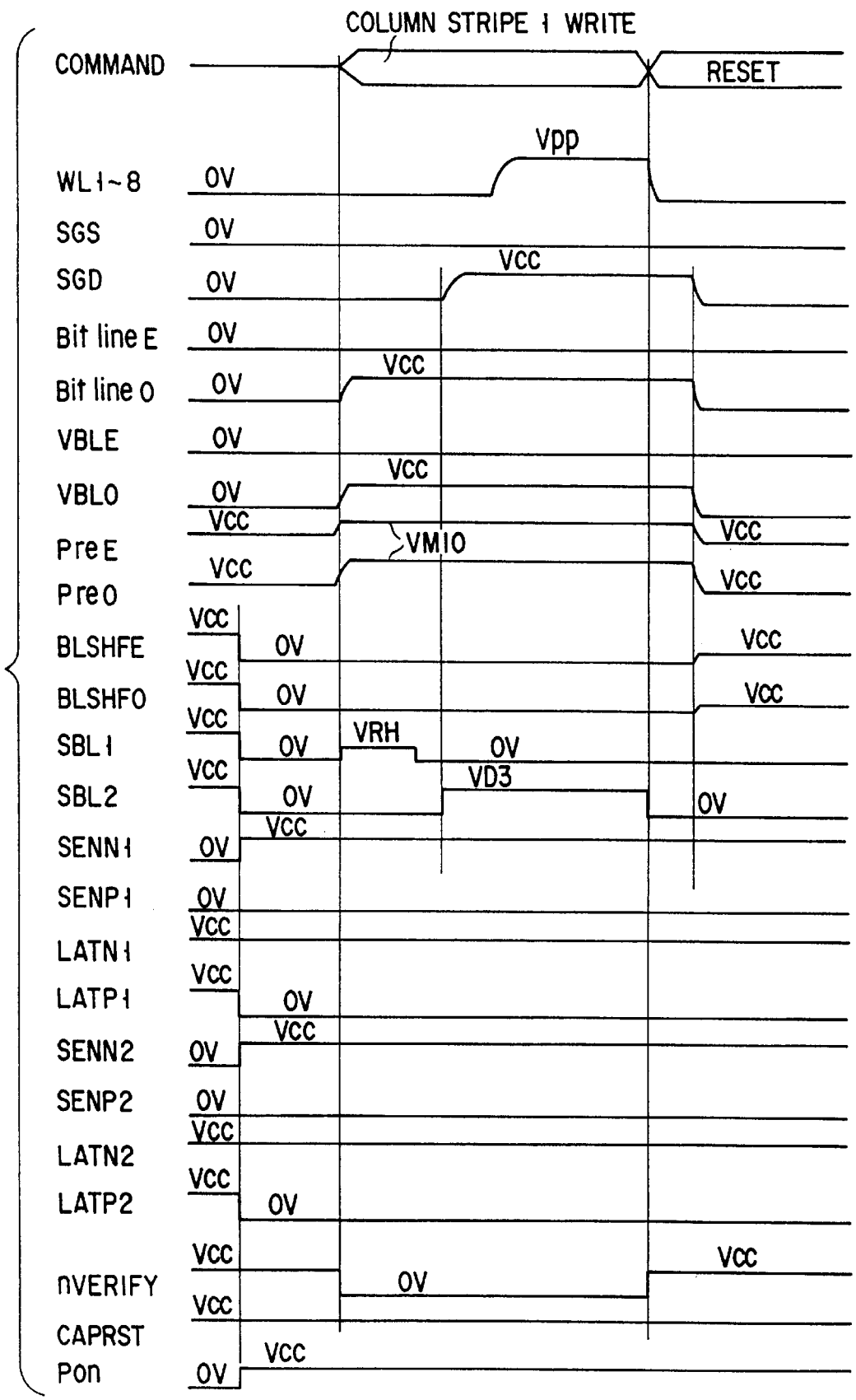
F I G. 24

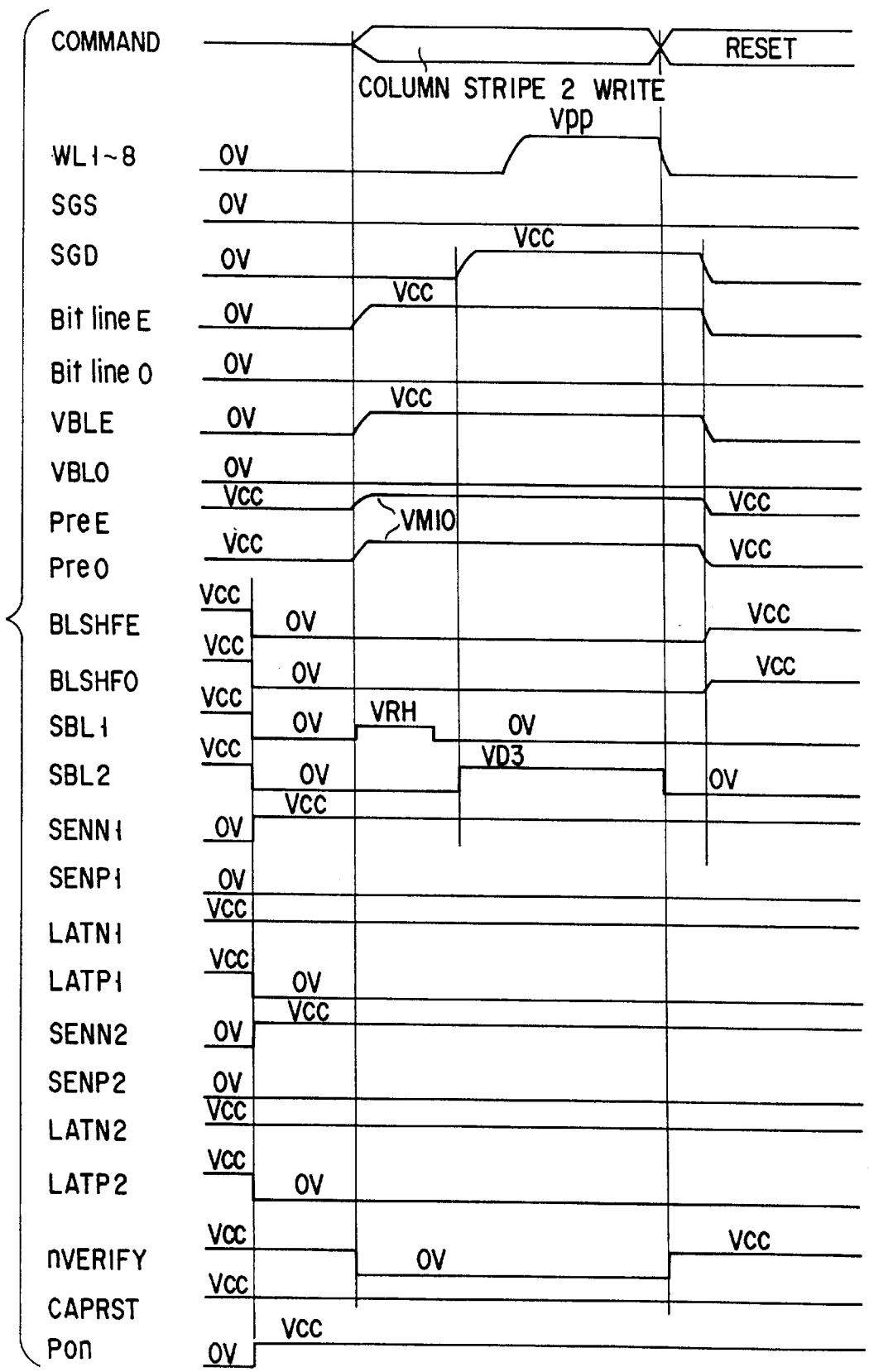
F I G. 25

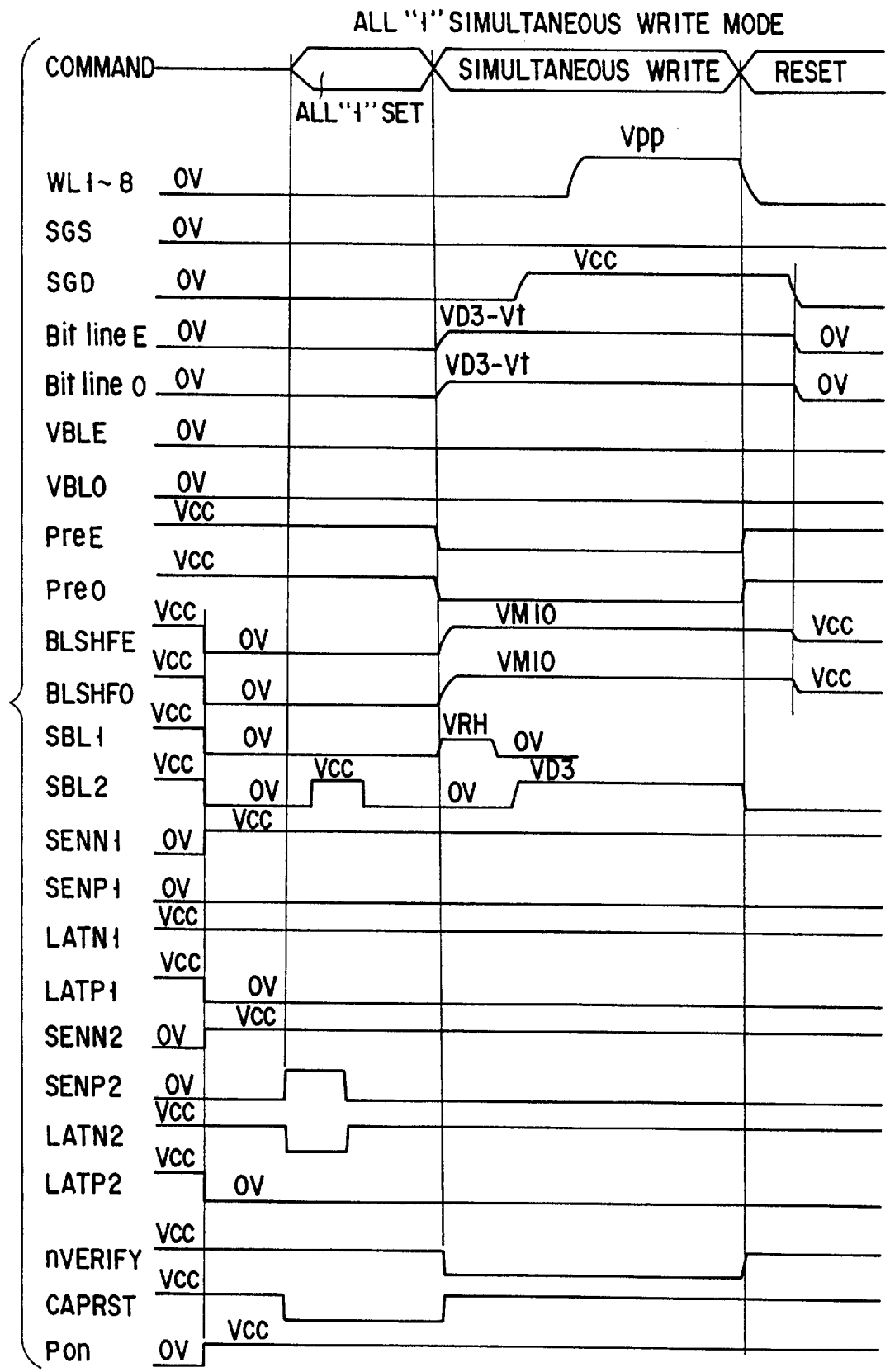
F I G. 27

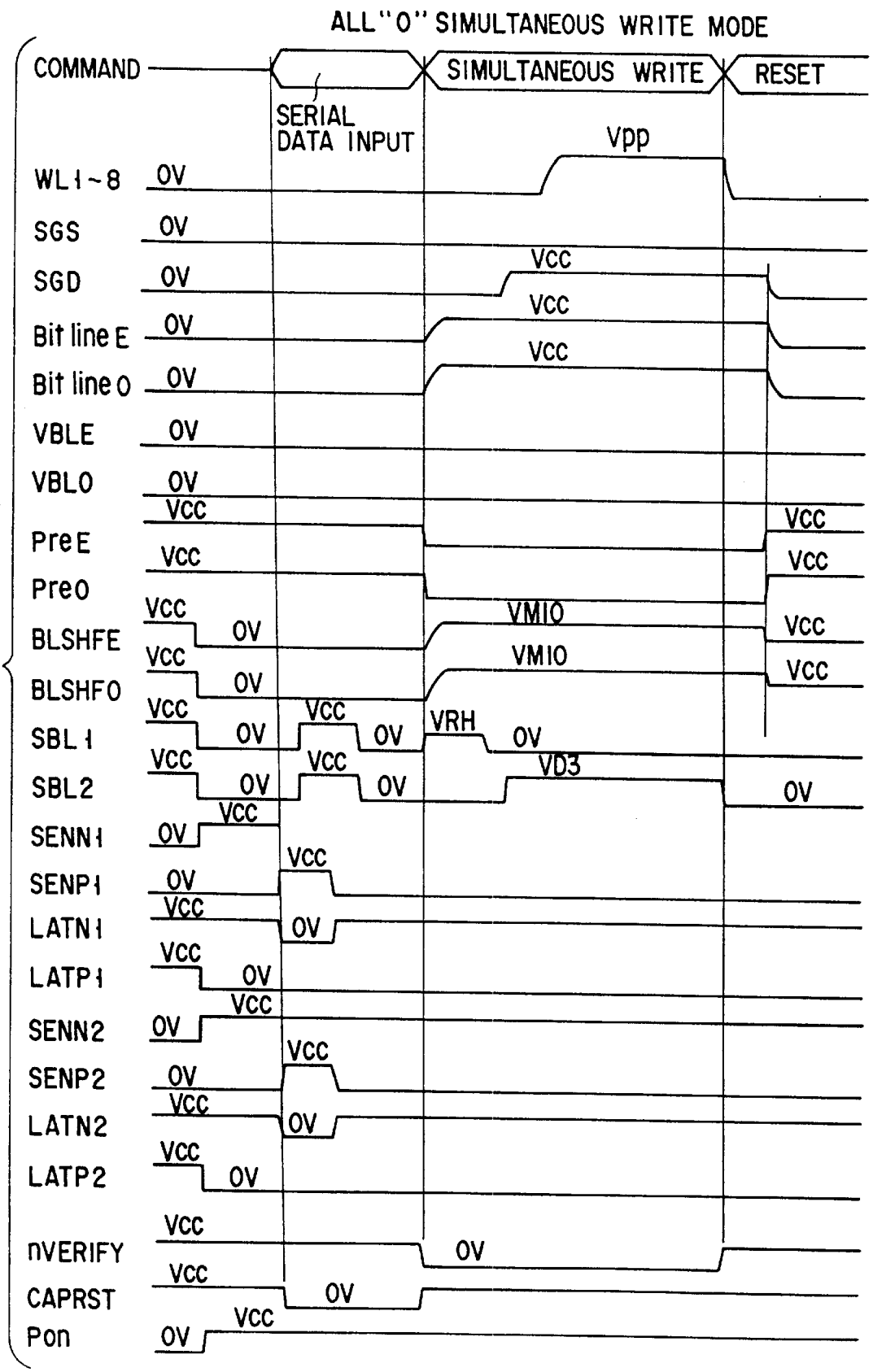
F I G. 28

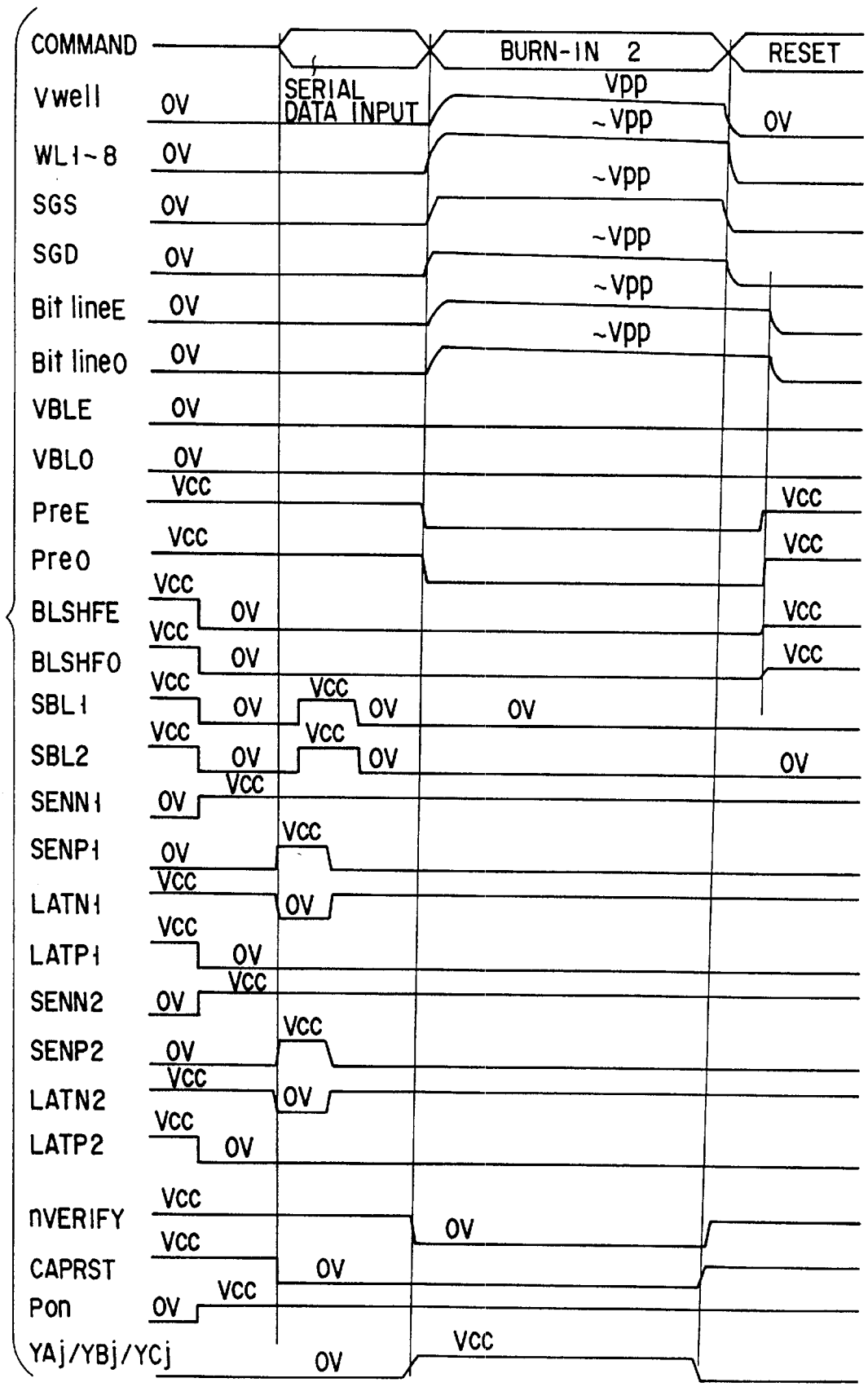
F I G. 30

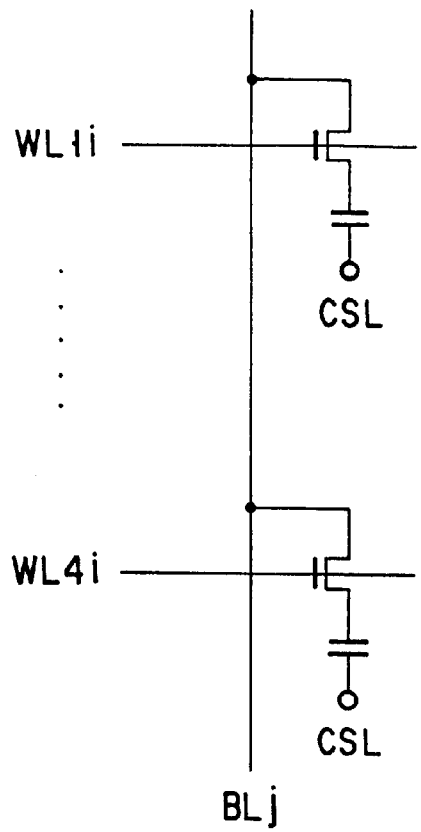
F I G. 31 A
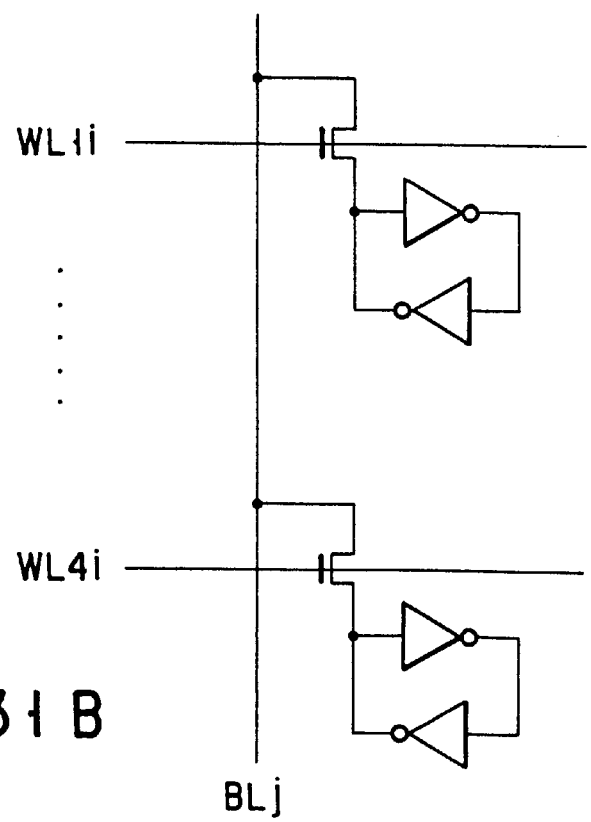
F I G. 31 B

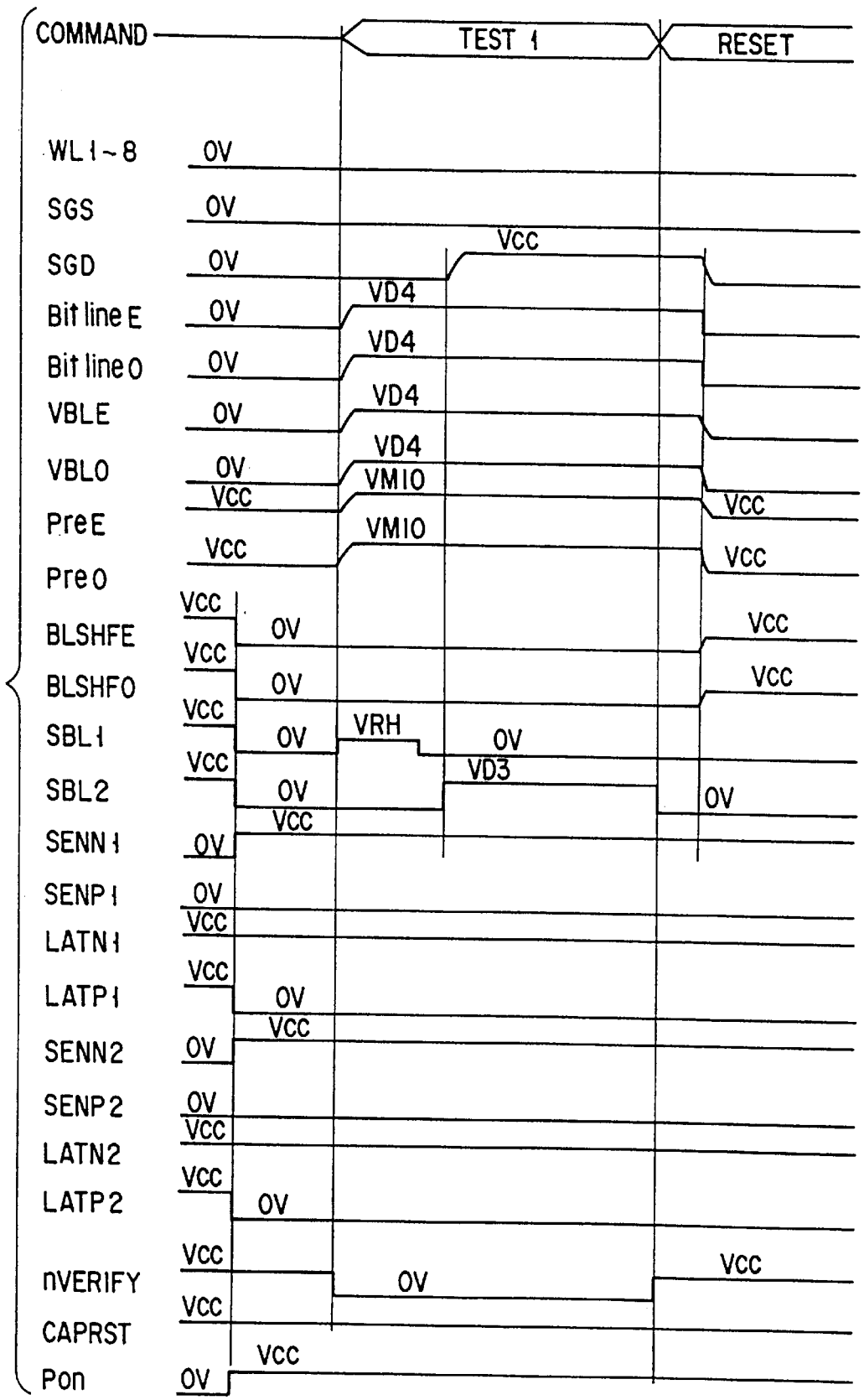
F I G. 32

SEMICONDUCTOR MEMORY DEVICE

This application is a division of U.S. application Ser. No. 08/843,721, filed Apr. 17, 1997 now U.S. Pat. No. 6,072,719.

BACKGROUND OF THE INVENTION

This invention relates to a semiconductor memory device, and more particularly to a semiconductor memory device having an operation mode suitable for test.

A semiconductor memory device generally comprises: a memory cell array having memory cells, for storing data, arranged in a matrix and divided into a plurality of blocks; a row decoder that accesses the memory cell array block by block; word lines used to read the data stored in the memory cells; bitlines on which the voltage or current corresponding to the data appears; a sense amplifier that amplifies and outputs the bitline voltage in a read operation and supplies the bitline voltage according to the writing data in a write operation, and so on.

Like all of the other products, semiconductor memory devices are tested for reliability and other factors. The cost required for a test depends on the time required for the test. To reduce the cost needed for the test, the test time must be shortened. To achieve this, a voltage has been applied to a plurality of memory cells and the peripheral circuits at the same time, thereby shortening the testing time.

A test for simultaneously rewriting the data in all memory cells is carried out by selecting all blocks and setting all word lines at the writing voltage. When there is a defective memory cell, however, a leakage current due to the defect is too large, so that the writing voltage level drops, sometimes making the simultaneous test impossible. Should this happen, making the block including the defective block unselected enables the memory cells in the other blocks to be tested simultaneously. In the conventional semiconductor memory device, however, since all blocks are selected or blocks are selected one by one, this causes the problem of having to select the blocks not including the defective memory cell one by one.

In the electrically rewritable nonvolatile semiconductor memory device (EEPROM) disclosed in ISSCC Digest of Technical Papers, pp. 128–129, Feb., 1995, a row decoder using only nMOS transfer gates is used. With the row decoder, in the selected state, a transfer gate turns on and a voltage is applied to a word line. In the unselected state, the transfer gate turns off and the word line is brought into the floating state.

When there is a leak in a bitline, the data in the memory cell is read erroneously. Such a defective bitline must be replaced with a redundancy bitline free from leak current. To do this, a check has to be made to see if there is any leak in the bitline. In the conventional semiconductor memory device, because a read operation is carried out with all blocks in the unselected state, a junction leak in the bitline contact can be sensed. When the word line in the floating state is short-circuited with the bitline, there is no leak, so that the short circuit cannot be sensed.

Furthermore, to improve the yield of the semiconductor memory device, redundancies are used to replace the defective column or defective row with a good one. Conventional redundancies have the following problem: when a column or row becomes defective in a test after the replacement, the chip becomes defective. Moreover, because a semiconductor memory device capable of storing multi-values has generally a long writing time, the time required for a rewriting test is also long.

As described above, in the conventional semiconductor memory device, when there is a defective block having a defective memory cell, it is impossible to test the simultaneous rewriting of the data in all memory cells by selecting all blocks and setting all word lines at the writing voltage. Moreover, when a check is made to see if there is any leak in the bitlines, a read operation is performed with all blocks in the unselected state, so that a junction leak in the bitline contacts can be sensed, but short circuit between the floating word lines and bitlines cannot be sensed.

There is also another problem: when the redundancy circuit for replacing a defective column or a defective row malfunctions, the chip becomes defective. In addition, because a semiconductor memory device capable of storing multi-values has generally a long writing time, the time required for a rewriting test is also long.

A semiconductor memory device comprises: a memory cell array having memory cells arranged in a matrix; word lines and bitlines for reading the data from the memory cells; and a sense amplifier and latch circuit. The sense amplifier and latch circuit senses the bitline voltage corresponding to the data in reading the data from the memory cells and outputs the voltage corresponding to the writing data in writing the data into the memory cells.

The manufacturing cost of semiconductor memory devices gets higher as the chip area increases and gets still higher as the testing time gets longer. In conventional semiconductor memory devices, to reduce the cost, not only the area of memory cells but also the area occupied by their peripheral circuits are made as small as possible. For instance, an attempt is made to reduce the area by causing more than one bitline to share a sense amplifier and latch circuit and thereby reducing the number of sense amplifier and latch circuits in the chip. To shorten the testing time, a method of selecting more than one bit simultaneously and writing the data in a test is employed.

When more than one bitline shares a sense amplifier and latch circuit, however, because only one bitline is connected to a single sense amplifier and latch circuit, of the memory cells selected by one word line, only the memory cell connected to one bitline per sense amplifier and latch circuit is selected. Therefore, in this case, although the circuit area decreases, the testing time increases to a value corresponding to the number of bitlines per sense amplifier and latch circuit, resulting in a small cost reduction.

In contrast, with a memory capable of storing multi-values, because a single memory cell has a memory capacity more than one bit, the cost can be reduced as compared with a conventional memory where a single memory cell has one bit. Since the logical values in the circuit are binary, more than one sense amplifier and latch circuit for reading and writing the data into and from the multi-valued memory cells is needed for one bitline. Therefore, in a semiconductor memory for storing multi-values, it is particularly necessary to cause more than one bitline to share a sense amplifier and latch circuit. In this case, too, the testing time increases to a value corresponding to the number of bitlines per sense amplifier and latch circuit, resulting in a small cost reduction.

As described above, in conventional semiconductor memory devices where more than one bitline share a sense amplifier and latch circuit, the time required for operation tests increases to a value corresponding to the number of bitlines per sense amplifier and latch circuit, which becomes the factor that prevents the manufacturing cost of semiconductor memory devices from decreasing.

BRIEF SUMMARY OF THE INVENTION

The object of the present invention is to provide a semiconductor memory device capable of shortening the time required for product testing and reducing the cost needed for the testing.

A semiconductor memory device according to a first aspect of the present invention employs the following structures:

(1) In a semiconductor memory device comprising a memory cell array with a plurality of blocks each having a plurality of memory cells arranged in a matrix, a plurality of address latch circuits provided so as to correspond to the blocks, and a row decoder that accesses the memory cell array block by block according to the latched state of the plurality of address latch circuits, (1-1) A control circuit for accessing the memory cell array by latching all of the blocks into the selected state and then canceling the address latching of the predetermined block into the unselected state is further provided.

(1-2) The determined block canceled the address latching thereof includes a previously checked faulty block.

(1-3) The control circuit has an operation mode for selecting all of the plurality of selected blocks and all word lines and reading the data.

(1-4) The control circuit has an operation mode for selecting all of the plurality of selected blocks and all word lines and writing the data.

(1-5) The control circuit has an operation mode for selecting all of the plurality of selected blocks and all word lines and erasing the data.

With the present invention, in the semiconductor memory device where the row decoder is provided with the block address latch circuits, after all blocks are brought in unison into the selected state, the address latching of the defective block can be canceled to the unselected state, so that it is unnecessary to select the blocks except for the defective block one by one, facilitating the simultaneous writing, erasing, and reading of the data into and from the good blocks.

With the row decoder including nMOS transfer gates, because a bitline leak check is made by selecting more than one block and more than one global word line simultaneously and reading the data, short circuit between word lines and bitlines can be sensed.

(3) A semiconductor memory device comprises a memory cell array including memory cells arranged in rows and columns in a matrix, and a plurality of redundancy circuits capable of replacing rows or columns, in which at least one redundancy circuit can be replaced with at least one another redundancy circuit. By making it possible to replace a row or column redundancy with another, a defect in redundancy does not lead directly to a defective chip, which improves the yield.

(4) A semiconductor memory device comprises a memory cell array having a plurality of memory cells arranged in a matrix each of which is capable of having an n physical quantities ($n \geq 3$) to store one of n-levels, and a control circuit for rewriting the data in the memory cells, in which the control circuit simultaneously rewrites the data in a desired plurality of memory cells from the minimum level item corresponding to the minimum one of the n physical quantities to the maximum level item corresponding to the maximum one of the n physical quantities or from the maximum level item corresponding to the maximum one of the n physical quantities to the minimum level item corresponding to the minimum one of the n physical quantities. Where, the control circuit simultaneously rewrites the data in all of the plurality of memory cells. The memory cell array includes at least one block, and the control circuit simultaneously rewrites the data in the memory cells in the block.

In the multi-valued memory, the testing time can be shortened by rewriting the contents of more than one memory cell simultaneously from the minimum state to the maximum state or from the maximum state to the minimum state. Moreover, in the nonvolatile semiconductor memory device that stores information by accumulating charges in the charge storage layer and providing the memory transistor with more than one threshold voltage according to the amount of accumulated charges, the simultaneous acceleration test of reading the data from more than one memory cell or of retaining data items can be realized by making positive the voltage of the well with respect to the gate in the memory cell.

As described above, according to the first aspect of the present invention, because all blocks are simultaneously brought into the selected state and thereafter the address latching of the defective block is canceled to the unselected state, the test of simultaneously writing, erasing, and reading the data into and from the good blocks can be carried out easily. Furthermore, in the test of rewriting the data in the multi-valued memory, the stress per rewriting can be maximized. Therefore, the time required for product testing can be shortened, making it possible to realize a semiconductor memory device that contributes to the reduction of the cost required for the testing.

Furthermore, in the bitline leak check, short circuit between word lines and bitlines can be sensed and defects in the redundancies can be redressed. Therefore, it is possible to improve the reliability of the testing and improve the yield of products.

A semiconductor memory device according to a second aspect of the present invention has the following structures:

(1) In a semiconductor memory device comprising a memory cell array having a plurality of memory cells arranged at intersections of a plurality of bitlines and a plurality of word lines, a sense amplifier and latch circuit that is selectively connected to the plurality of bitlines and senses the bitline voltage corresponding to a data in reading the data from a memory cell and outputs the voltage corresponding to the writing data onto a bitline in writing the data into a memory cell, and a precharge circuit that is selectively connected to the plurality of bitlines and outputs a voltage for preventing the change of the data in memory cells onto the plurality of bitlines unconnected to the sense amplifier and latch circuit in writing the data into a memory cell, (1-1) A control circuit for disconnecting the sense amplifier and latch circuit from all of the plurality of bitlines, connecting the precharge circuit to all of the plurality of bitlines, outputting at least one of a writing voltage and an unwriting voltage onto all of the plurality of bitlines, and simultaneously writing the data into a plurality of memory cells sharing the selected word line is further provided.

(1-2) A control circuit for disconnecting the sense amplifier and latch circuit from all of the plurality of bitlines, connecting the precharge circuit to all of the plurality of bitlines, outputting a writing voltage onto one of two adjacent bitlines and an unwriting voltage onto the other of the two adjacent bitlines, and simultaneously writing the data into a plurality of memory cells sharing the selected word line is further provided.

(2) In a semiconductor memory device comprising a memory cell array having a plurality of memory cells arranged at intersections of a plurality of bitlines and a plurality of word lines, a sense amplifier and latch circuit that is selectively connected to more than one bitline and senses the bitline voltage corresponding to a data in reading the data in a memory cell and outputs the voltage corresponding to the writing data onto a bitline in writing the data into a memory cell, and a precharge circuit that is selectively connected to a bitline and outputs a voltage for preventing the change of the data in memory cells onto the bitlines unconnected to the sense amplifier and latch circuit in writing the data into a memory cell, (2-1) The sense amplifier and latch circuit is disconnected from all bitlines and the precharge circuit is connected to all bitlines to output a writing voltage or an unwriting voltage onto the bitlines, thereby simultaneously writing the same data into the memory cells sharing the selected word line, (2-2) A control circuit for disconnecting the precharge circuit from the plurality of bitlines, connecting the sense amplifier and latch circuit to the plurality of bitlines, and simultaneously writing the same data into a plurality of memory cells sharing the selected word line is further provided.

(2-3) The sense amplifier and latch circuit is latched so as to output the writing voltage, and the precharge circuit is connected to the bitline with the sense amplifier and latch circuit.

(2-4) The sense amplifier and latch circuit is disconnected from all bitlines and the precharge circuit is connected to bitlines to output the writing voltage or the unwriting voltage onto the bitlines, thereby simultaneously writing the data into the memory cells sharing the selected word line.

(2-5) A control circuit for latching the sense amplifier and latch circuit so as to output at least one of a writing voltage and an unwriting voltage onto the plurality of bitlines and disconnecting the sense amplifier and latch circuit from all of the bitlines. Furthermore, after the precharge circuit is disconnected from the bitlines and all blocks are brought into the unselected state, an erase operation is carried out.

(3) A semiconductor memory device comprises a memory cell array having a plurality of memory cells arranged at intersections of a plurality of bitlines and a plurality of word lines, a sense amplifier and latch circuit that senses the bitline voltage corresponding to a data in reading the data in the plurality of memory cells and outputs the voltage corresponding to the writing data onto bitlines in writing the data in the plurality of memory cells, a plurality of column decoders that selects the sense amplifier and latch circuit and connects it to an input/output line, and a control circuit for bringing the plurality of column decoders into the selected state simultaneously.

(4) In items (1) and (2), a writing voltage is applied to the plurality of word lines in the simultaneous writing.

(5) In items (1) and (2), after more than one block is brought into the selected state, the writing voltage is applied to more than one word line.

(6) In items (1) and (2), all of the plurality of word lines are prevented from being applied a writing voltage thereto.

(7) In items (1) and (2), more than one column decoder is brought into the selected state simultaneously.

(8) In items (1), (2) and (3), the memory cells are capable of storing n-levels (n≧3).

According to the second aspect of the present invention, in carrying out an operation test, the data items can be simultaneously written into the memory cells sharing the selected word line even with different bitlines by connecting all bitlines to the sense amplifier and latch circuit with the precharge circuit disconnected from the bitlines. Similarly, the data items can be simultaneously written into the memory cells sharing the selected word line even with different bitlines by connecting all bitlines to the precharge circuit with the sense amplifier and latch circuit disconnected from the bitlines. Namely, connecting the sense amplifier and latch circuit or precharge circuit to all bitlines enables the data to be written into the memory cells with more than bitlines simultaneously, which shortens the testing time. Since all bitlines are selected simultaneously and simultaneous writing or a stress test can be carried out, the time required for testing can be shortened and the cost can be reduced. Moreover, because all bitlines can be selected, regardless of the latched data, and simultaneous writing or a stress test can be carried out, the time needed for testing can be shortened and the cost be reduced.

Furthermore, when the precharge circuit is connected to all bitlines with the sense amplifier and latch circuit disconnected from the bitlines, outputting the writing voltage and unwriting voltage onto two adjacent bitlines enables a stress test between these bitlines.

Still furthermore, testing the transistors except for the cell section can be easily done by connecting the sense amplifier and latch circuit and the precharge circuit to the bitlines, while latching the sense amplifier and latch circuit so as to output the writing voltage and keeping the voltage of the precharge circuit at the same voltage of the sense amplifier and latch circuit, or by disconnecting the sense amplifier and latch circuit from all bitlines, while latching the sense amplifier and latch circuit so as to output the writing voltage or unwriting voltage onto the bitlines. At this time, by bringing more than one column decoder into the selected state simultaneously, the time required for testing the transistors expect for the cell section can be shortened and the cost can be reduced.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of the structure of a semiconductor memory device according to a first embodiment of the present invention;

FIG. 6 is a voltage waveform diagram pertaining to the test of simultaneously selecting blocks and writing the data into them;

FIG. 7 is a voltage waveform diagram pertaining to the test of simultaneously selecting blocks and erasing the data from them;

FIG. 19 is a waveform diagram of the operation of writing the data;

FIG. 20 is a waveform diagram of the operation of erasing the data;

FIG. 23 is a waveform diagram pertaining to a method of testing the writing of the same data item into all memory cells, simultaneously;

FIG. 24 is a waveform diagram pertaining to a method of testing the writing of different data items onto every other bitline;

FIG. 25 is a waveform diagram pertaining to a method of testing the writing of different data items onto every other bitline;

FIG. 27 is a waveform diagram pertaining to another method of testing the writing of the same data item into all memory cells, simultaneously;

FIG. 28 is a waveform diagram pertaining to another method of testing the writing of the same data item into all memory cells, simultaneously;

FIG. 30 is a burn-in operation waveform diagram;

FIGS. 31A and 31B are examples of a DRAM and an SRAM, respectively; and

FIGS. 32 to 35 show the other burn-in operation waveform diagrams.

DETAILED DESCRIPTION OF THE INVENTION

Figure 2:
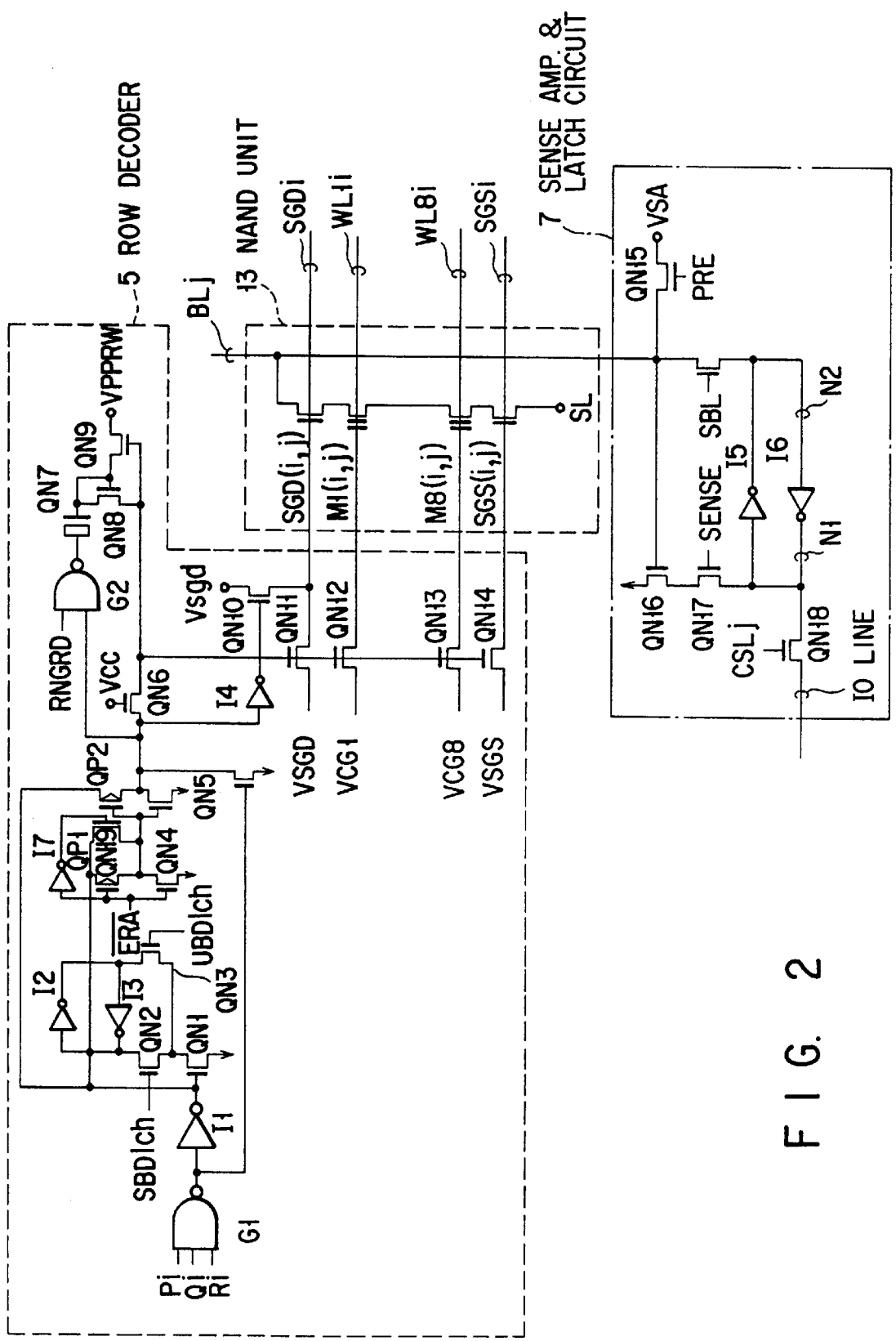
FIG. 2 is a circuit diagram of the important part of the semiconductor memory device according to the first embodiment.

Hereinafter, referring to the accompanying drawings, embodiments of the present invention will be explained.

(First Embodiment)

FIG. 1 is a block diagram of a semiconductor memory device according to a first embodiment of the present invention.

A command buffer 3 transfers control signals to the well voltage control circuit 2 in a memory cell array 4, a row decoder 5, a global word line driving circuit 6, a bitline control circuit 7, a row address generator circuit 10, and a column address generator circuit 11, according to the input command. The writing data and reading data are exchanged with the related circuitry outside the semiconductor memory device 1 via an IO buffer 8. The bitline control circuit 7 is connected to the bitlines of the memory cells. A column decoder 9 controlled by the output of the column address generator circuit 11 connects the selected bitline control circuit 7 to the IO buffer 8.

FIG. 2 is a circuit diagram of the important part of the device of the present invention. In the embodiment, the memory cell array is such that NAND units 13 are arranged in a matrix. Eight word lines constitute a block. Select gates SGD and SGS are connected to both ends of memory cells M1 to M8 connected in series.

Figure 3:
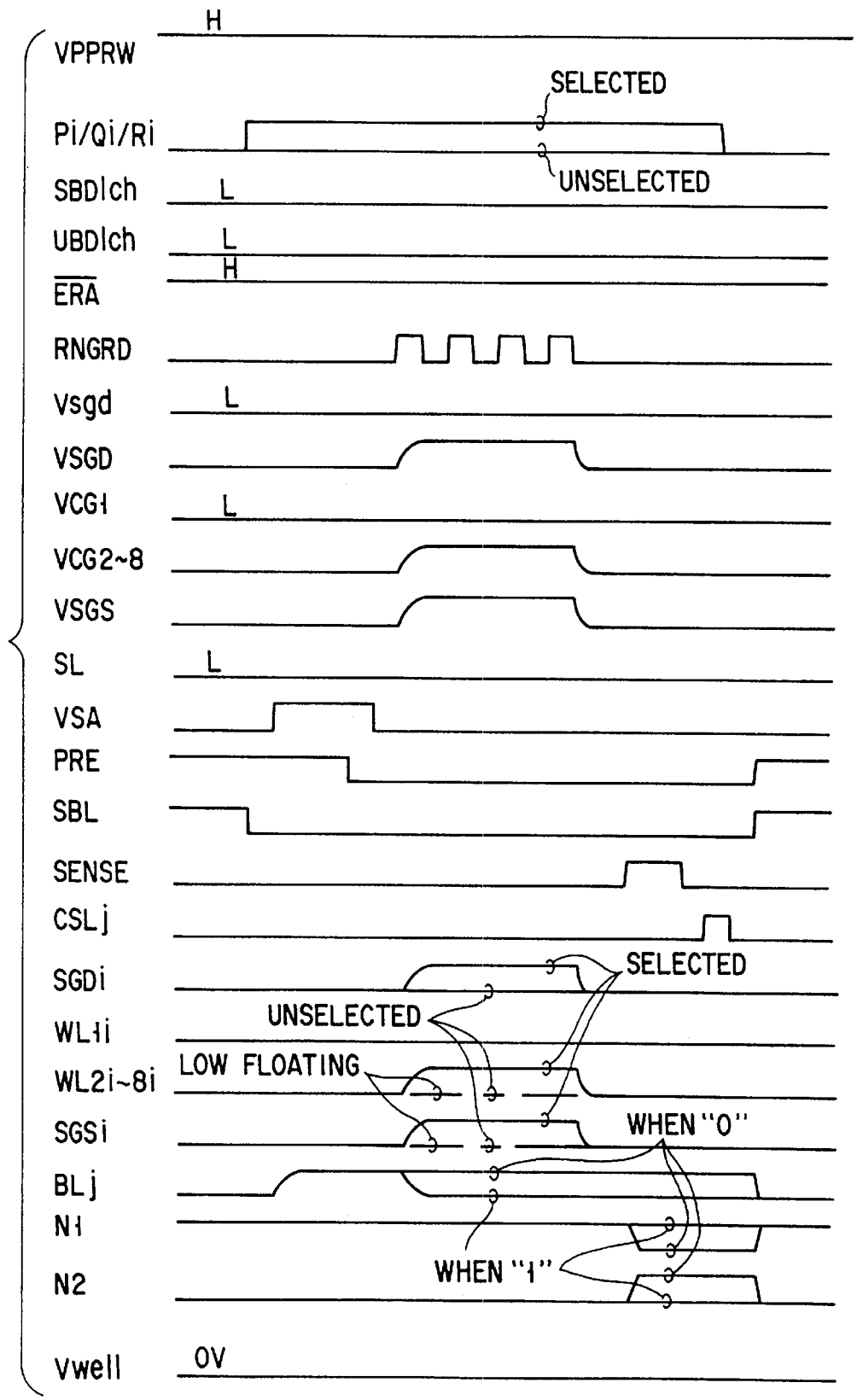
FIG. 3 is a voltage waveform diagram for explaining a normal read operation.

FIG. 3 is a waveform diagram for explaining the operation of normal reading. In a standby state, PRE and SBL are set high, VSA is set low, all of the bitlines BLj and node N2 are set low, and node Ni is set high. All of row addresses Pi, Qi, and Ri are set low in a standby state and the transfer gates QN11 to QN14 in all of the blocks are off.

After SBL goes low, VSA goes high, and the bitlines are precharged. At this time, the selected addresses Pi, Qi, and Ri go high, turning on all of the transfer gates QN11 to QN14. In contrast, the unselected addresses Pi, Qi, and Ri remain low, so that all of the transfer gates QN11 to QN14 are off.

Thereafter, PRE goes low, bringing the bitlines into the floating state. The selected global word line VCG1 remains low and the other VCG2 to VCG8 and global select lines VSGD and VSGS are made high. The word lines WL1i to WL8i and select gate lines SGDi, SGSi in the selected block go to the same potential as that of the global word lines VCG1 to VCG8 and global select lines VSGD, VSGS.

When the threshold voltage of selected memory cell Mi (i,j) is lower than 0V ("1"), bitline BLj will go low. When the threshold voltage is higher than 0V ("0"), the bitline will remain high. After the word line goes low, SENSE goes high. In this case, if the bitline is high, nMOS transistor QN16 will be on, inverting node N1 to the low level. If the bitline is low, nMOS transistor QN16 will be off, permitting node N1 to remain high. The data latched by inverters I5 and I6 is transferred to the IO buffer by the presence of a column select signal CLSj.

Figure 4:
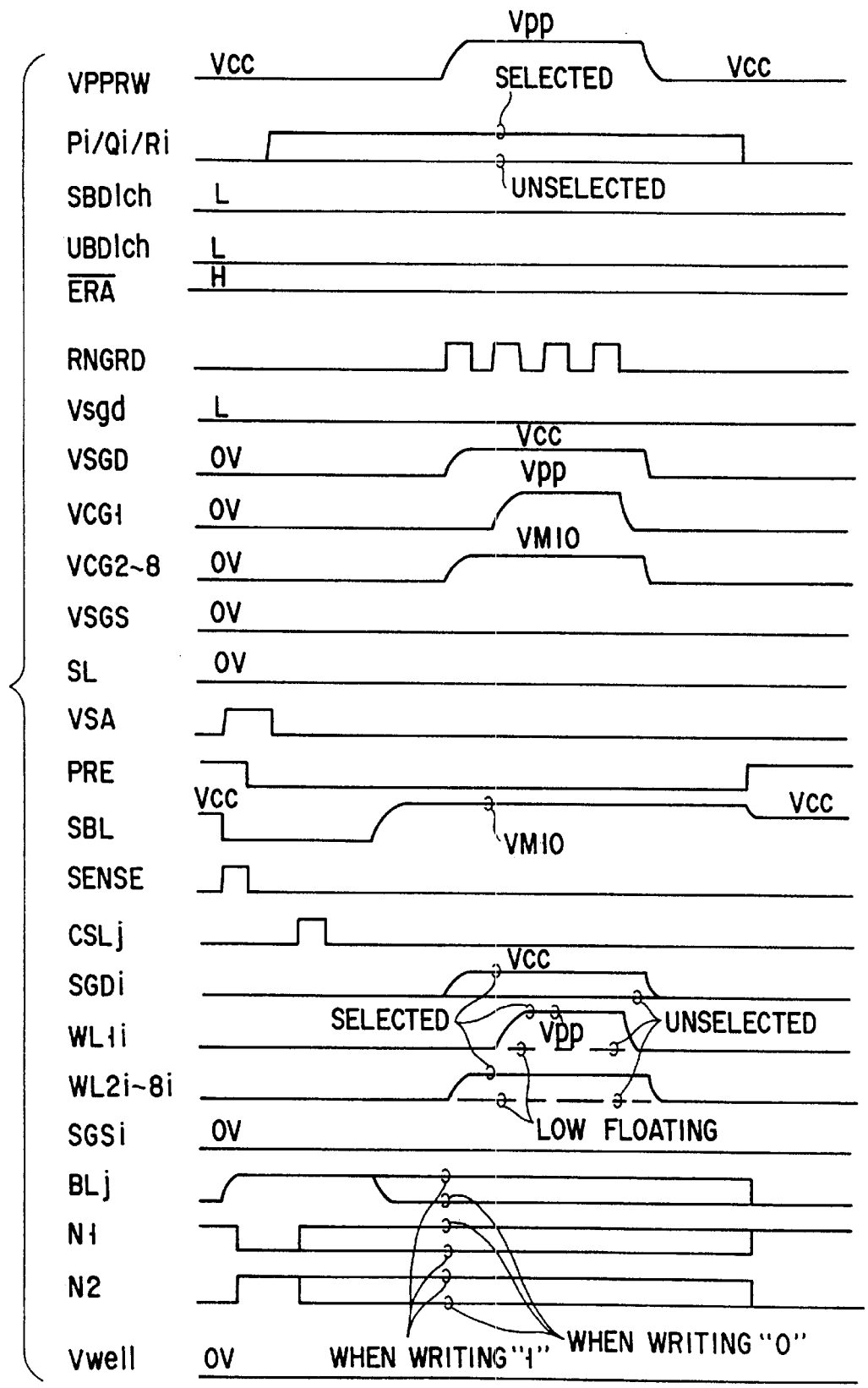
FIG. 4 is a voltage waveform diagram for explaining a normal read operation.

FIG. 4 is a voltage waveform diagram for explaining the operation of normal writing. After SBL goes low, VSA and SENSE go high. As a result of this operation, all of the internal nodes N1 in the sense amplifier and latch circuit 7 are set low. This is done to bring the column replaced with redundancies into the writing unselected state. At this time, the selected addresses Pi, Qi, Ri go high, turning on all of transfer gates QN11 to QN14. In contrast, the unselected addresses Pi, Qi, Ri remain low, so that all of transfer gates QN11 to QN14 are off.

The writing data is taken by CSLj from the IO line into the sense amplifier and latch circuit 7. Only when the "0" writing data is inputted, the state of the latch is reversed. After all of the writing data has been inputted, SBL is set at VM10 (about 10V) and the bitlines are set at 0V or VCC, depending on whether the writing data is "0" or "1." With the selected global word line VCG1 and global select line VSGS at the low level, the other VCG2 to VCG8 are set at VM10 and global select line VSGD is set at VCC.

Thereafter, the selected global word line VCGL is made VPP (about 20V). The word lines WL1i to WL8i and select gate lines SGDi, SGSi in the selected block are at the same potential as that of the global word lines VCG1 to VCG8 and global select lines VSGD, VSGS.

In writing "0," the potential difference between the gate and channel in a memory cell is VPP, allowing FN tunnel current to flow, with the result that the threshold voltage of the memory cell goes positive. In contrast, when "1" is written, because the potential difference between the gate and channel is low, no tunnel current will flow, with the result that the threshold voltage remains unchanged or negative.

Figure 5:
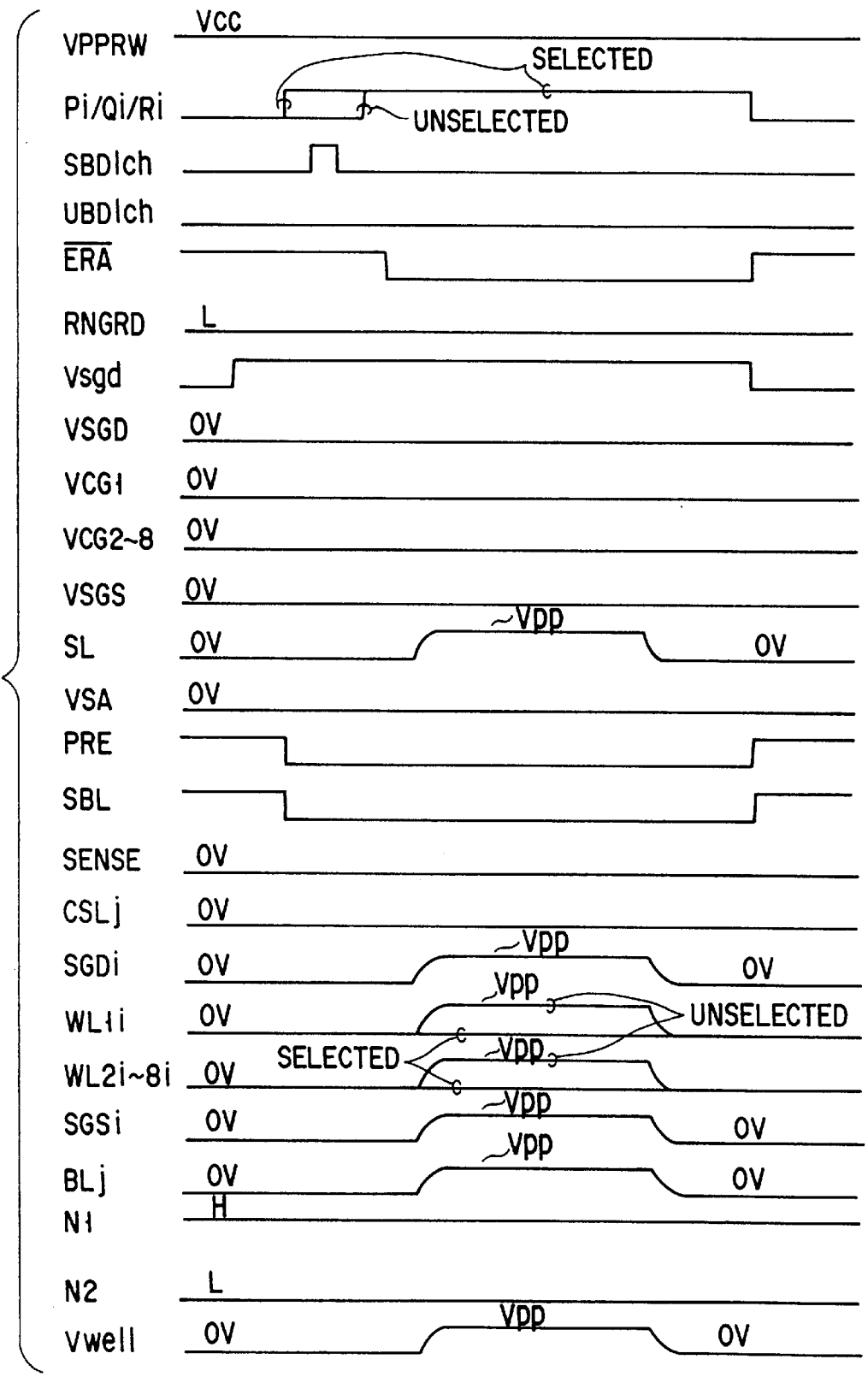
FIG. 5 is a voltage waveform diagram for explaining a normal erase operation.

FIG. 5 is a voltage waveform diagram for explaining the operation of normal erasing. After SBL and PRE go low, the selected addresses Pi, Qi, and Ri go high and SBD1ch goes high. As a result of this operation, the selected address is latched. More than one block address can be inputted. The block address latch circuit including the inverters I2 and I3 can select more than one block.

After SBD1ch goes low, all of the addresses Pi, Qi, and Ri go high and /ERA goes low. At this time, all of the transfer gates QN11 to QN14 in the selected block turn on. In contrast, the transfer gates QN11 to QN14 in the unselected block remain off. The well voltage Vwell of the memory cell is charged to VPP. The gate voltage of the selected memory cell is at 0V and that of the unselected memory cells in the floating state rises close to VPP because of the capacitive coupling with the well. Consequently, FN current flows between the gate and well in the selected memory cell because of a potential difference of VPP, making the threshold voltage of the memory cell negative.

In contrast, since the potential difference between the gate and well in the unselected memory cell is small, FN current does not flow, so that the threshold voltage remains unchanged. Because all of the select lines SGDi and SGSi are in the floating state, the voltages of them rise close to VPP. The bitlines BLj and source lines SL are also charged close to VPP, because their junction with the well is forward-biased.

FIG. 6 is a voltage waveform diagram of the operation of testing the writing of the data into blocks, simultaneously. This differs from a normal writing operation in Pi, Qi, Ri, SBD1ch, UBD1ch, and /ERA.

Before writing pulses are applied, all of Pi, Qi, and Ri are made high and SBD1ch is high, bringing all blocks into the selected state. Thereafter, the address of the previously examined faulty block is inputted. The selected state of the block is canceled to the unselected state with UBD1ch high. Thereafter, /ERA is made low, and the transfer gate is turned on or off, depending of the state of the latch circuit. This operation realizes the test of simultaneously writing the data into good memory cells. A simultaneous "0" writing test is carried out by setting all bitlines at 0V. A simultaneous "1" writing test is carried out by setting all bitlines at VCC.

FIG. 7 is a voltage waveform diagram for explaining the operation of testing the erasing of the data from blocks, simultaneously. This differs from a normal erasing operation in Pi, Qi, Ri, SBD1ch, UBD1ch, and /ERA.

Before erasing pulses are applied, all of Pi, Qi, and Ri are made high and SBD1ch is high, bringing all blocks into the selected state. Thereafter, the address of the previously examined faulty block is inputted. The selected state of the block is canceled to the unselected state with UBD1ch high. Thereafter, /ERA is made low, and the transfer gate is turned on or off, depending of the state of the latch circuit. This operation realizes the test of erasing the data from good memory cells, simultaneously.

Figure 8:
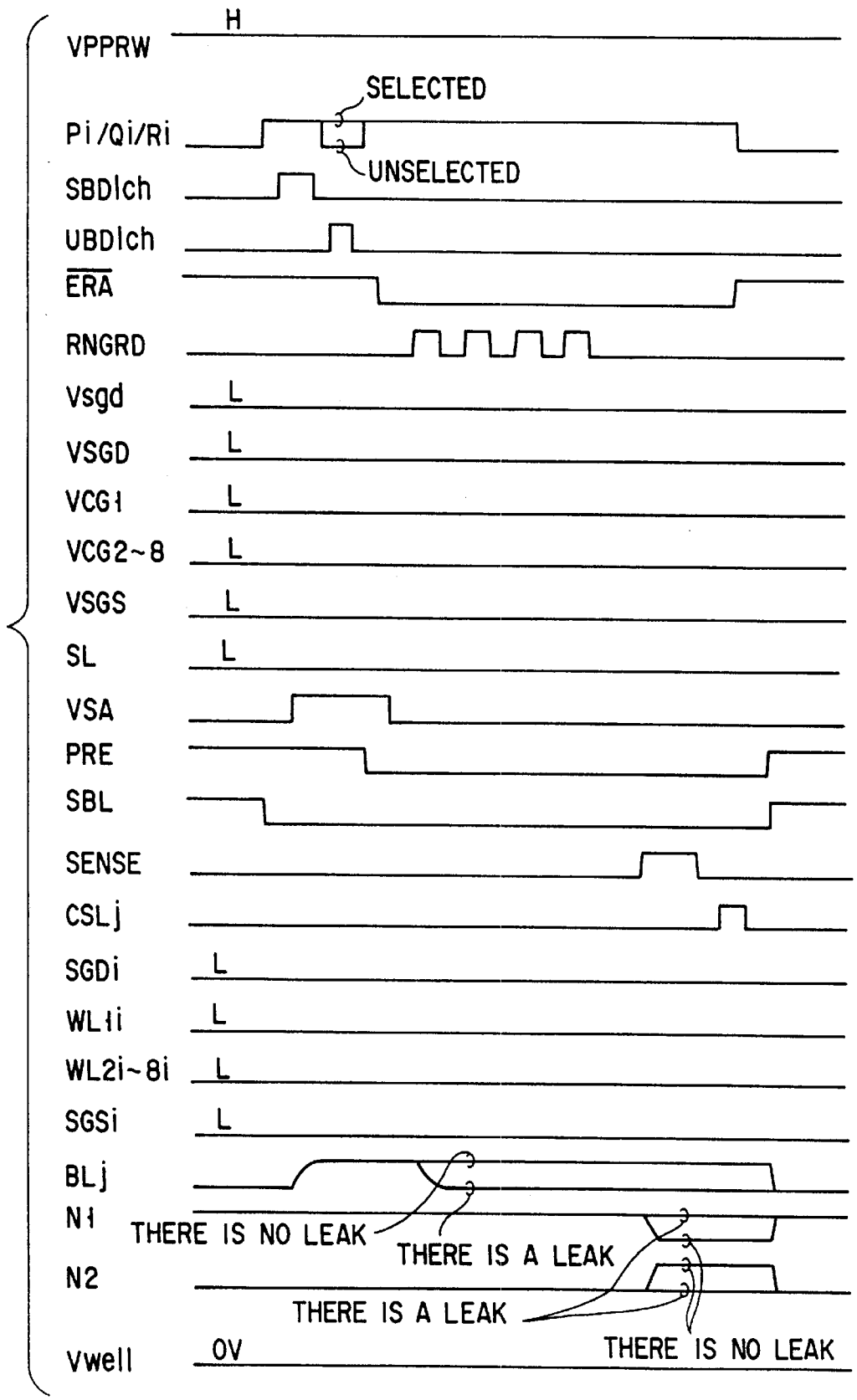
FIG. 8 is a voltage waveform diagram of bitline leak check.

FIG. 8 is a voltage waveform diagram of bitline leak check. This differs from a normal reading operation in Pi, Qi, Ri, SBD1ch, UBD1ch, /EAR, VSGD, VCG2 to VCG8, and VSGS.

All of Pi, Qi, and Ri are made high and SBD1ch is high, bringing all blocks into the selected state. Thereafter, the address of the previously examined faulty block is inputted. The selected state of the block is canceled to the unselected state with UBD1ch high. Thereafter, /ERA is made low, and the transfer gate is turned on or off, depending of the state of the latch circuit.

All of VCG1 to VCG8 are brought into the selected state and fixed at 0V and all of VSGD and VSGS are fixed at 0V. When there is not any bitline leak at all, all bitlines remain high. When a bitline with a leak goes low, the low state can be sensed. This operation realizes bitline leak check. When UBD1ch is fixed to the low level, a leak check can be made with all blocks in the selected state.

Figure 9:
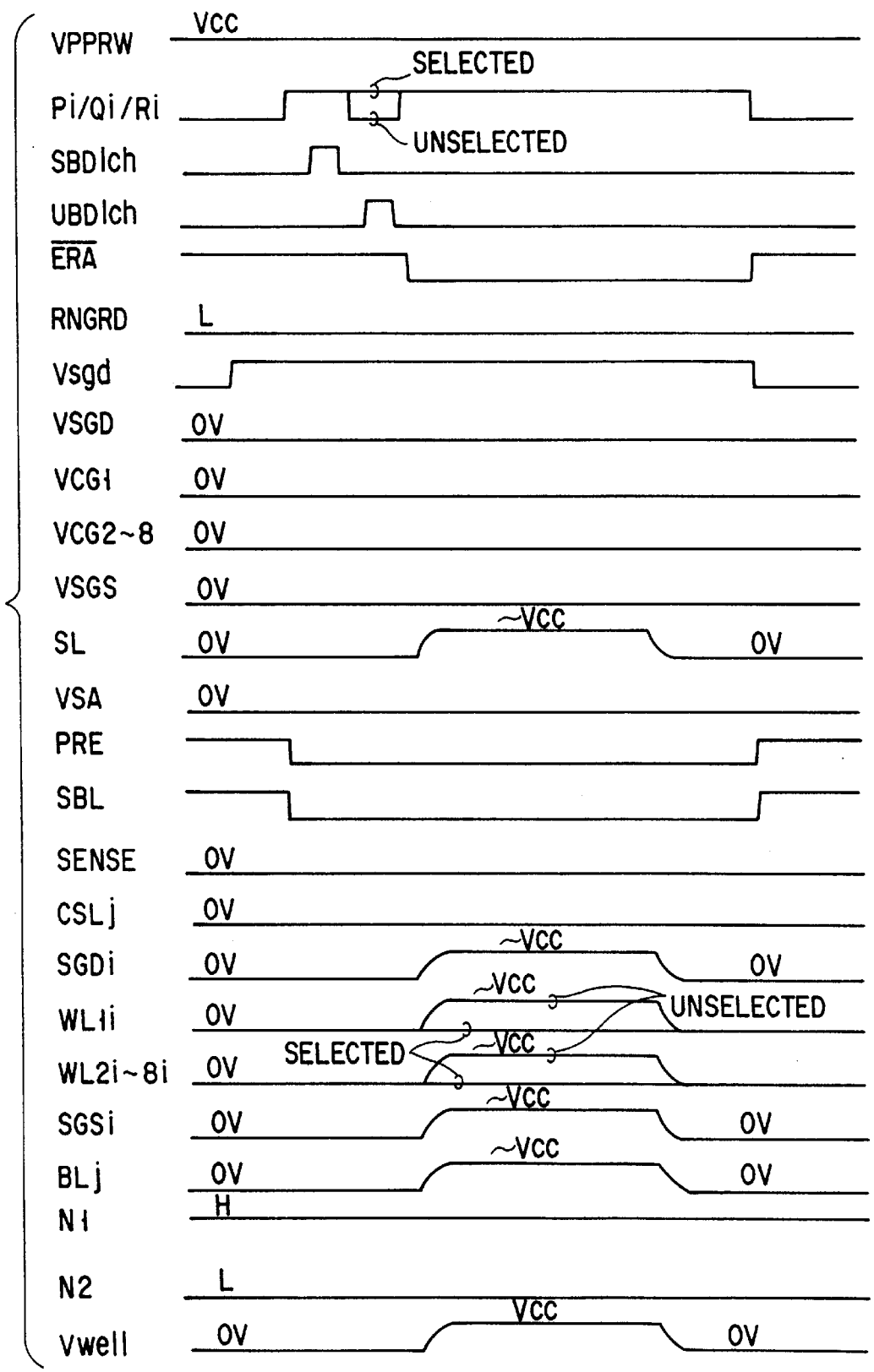
FIG. 9 is an operating voltage waveform diagram of the simultaneous acceleration test of reading the data from the memory cells that store "0" data.

FIG. 9 is a voltage waveform diagram of the operation of the simultaneous acceleration test of reading the data from the memory cells that store the "0" data. This differs from that of FIG. 7 only in the voltage level of Vwell. That is, when the voltage is lower than VPP, the voltage is made VCC. When a "0" cell is selected and is read from, there may be a case where the gate is at 0V and the drain is at VCC. With the embodiment, it is possible to carry out the simultaneous acceleration test of reading the data from all memory cells or the memory cells in more than one selected block.

As described above, with the embodiment, in the semiconductor memory device where the row decoder 5 is provided with the block address latch circuit (inverters I2 and I3), it is possible to bring all blocks simultaneously into the selected state and thereafter cancel the latching of the address of the faulty block to the unselected state. This makes it unnecessary to select the blocks except for the faulty one block by block, which facilitates testing the writing, erasing, or reading of the data into or from good blocks, simultaneously.

Furthermore, because in the row decoder including nMOS transfer gates, a bitline leak check is made by selecting blocks and block global word lines simultaneously and reading the data from them, short circuit between word lines and bitlines can be sensed.

(Second Embodiment)

Figure 10:
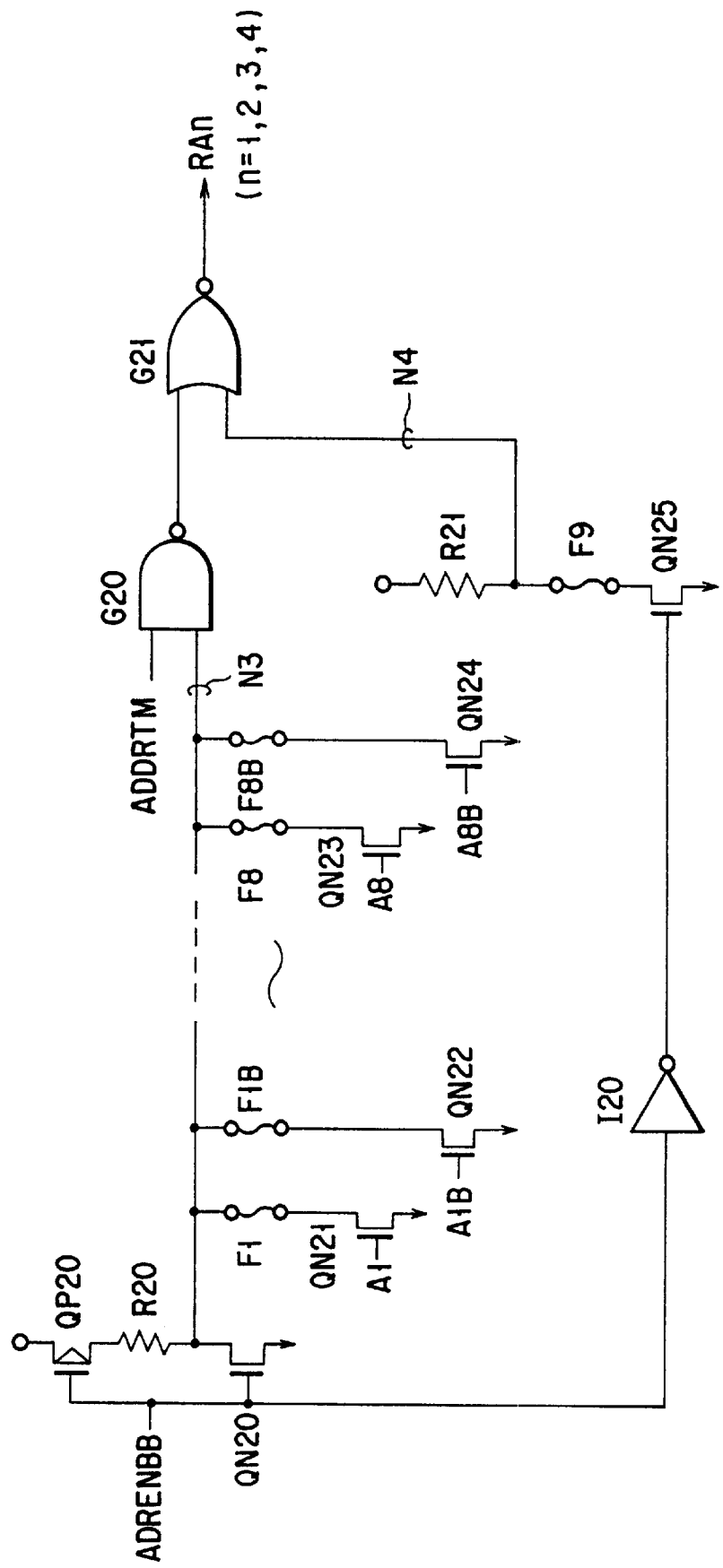
FIG. 10 is a circuit diagram of a redundancy address generator circuit according to a second embodiment of the present invention.
Figure 11:
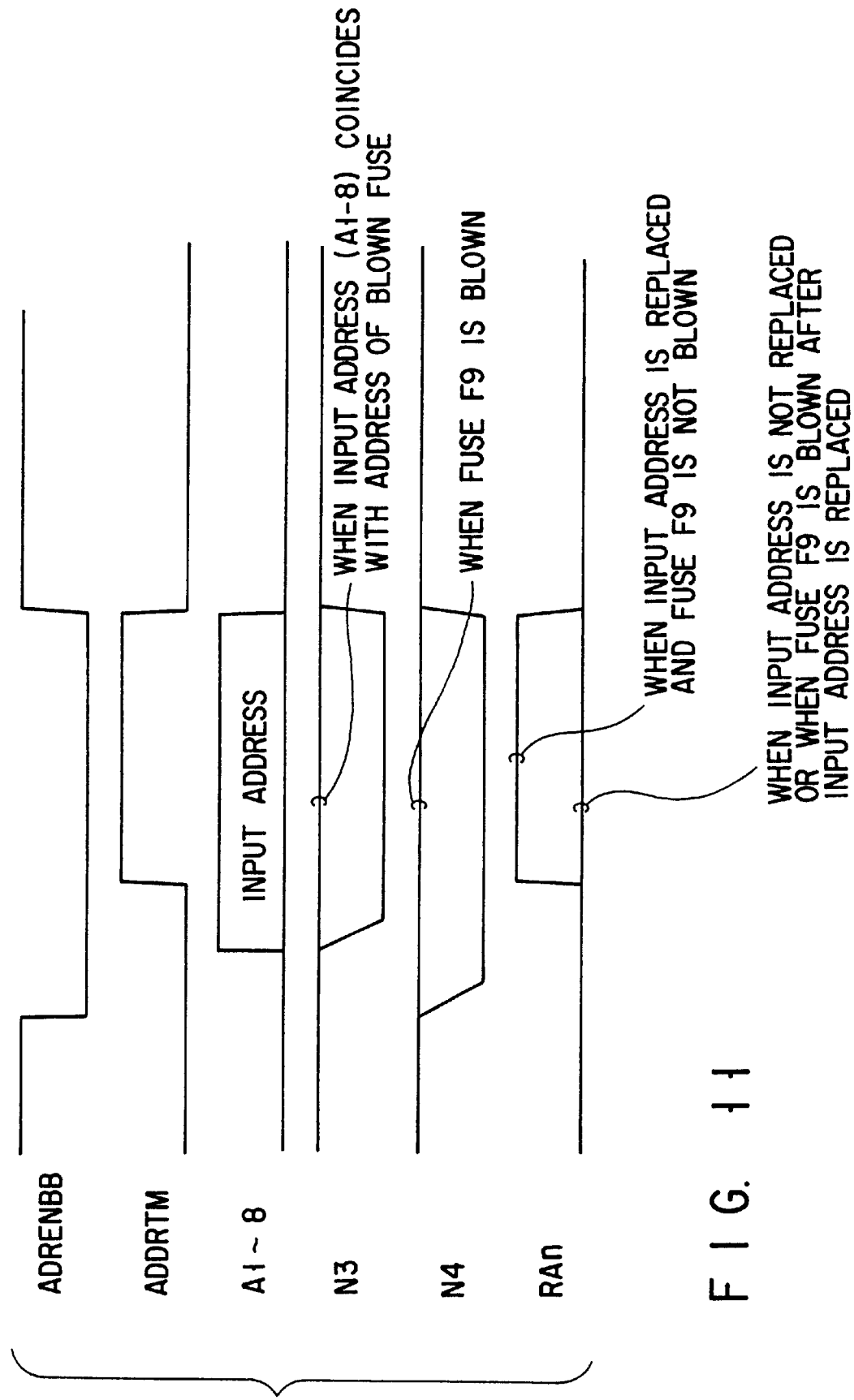
FIG. 11 is an operation waveform diagram in the second embodiment.

FIG. 10 is a circuit diagram of a redundancy address generator circuit for explaining a second embodiment of the present invention. FIG. 11 is a waveform diagram for explaining the operation of the circuit.

After ADRENBB goes low, address A1 to A8 is inputted. When address patterns A1 to A8 and 1B to 8B coincide with the patterns of blown fuses F1 to F8 and F1B to F8B, node N3 remains high. When the former do not coincide with the latter, node N3 goes low. In contrast, when the fuse F9 is blown, node N4 remains high, if not so, node N4 goes low. Therefore, when ADDRTM goes high, if the input address is replaced and thereafter fuse F9 is not blown, redundancy address RAn goes high.

In contrast, when the fuses corresponding to the input address are not blown or when the fuses corresponding to the input address are blown and thereafter the row or column replaced in the test malfunctions and fuse F9 is blown, redundancy address RAn goes low. When fuse F9 is blown, the row or column can be replaced again by programming another redundancy pattern.

With the second embodiment, because row or column redundancies can be replaced with each other, a faulty redundancy will not lead directly to a defective chip, therefore improving the yield.

(Third Embodiment)

Figure 12:
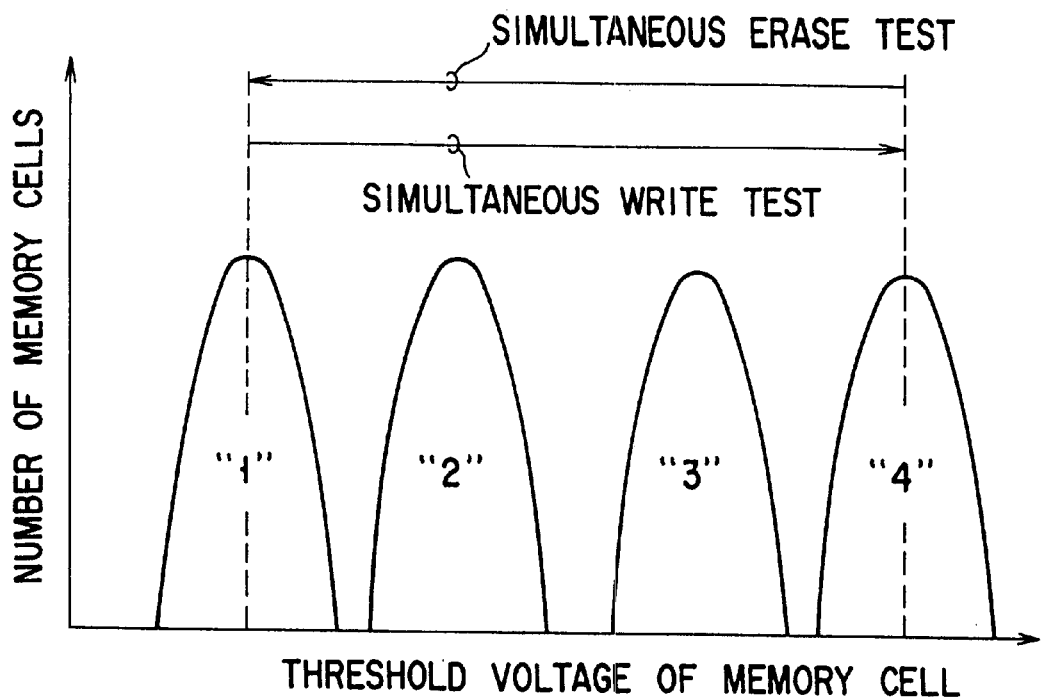
FIG. 12 is a diagram for explaining a simultaneous write/erase test in a multi-values storage nonvolatile memory according to a third embodiment of the present invention.

FIG. 12 is a diagram for explaining a method of testing the writing and erasing of the data into and from a multi-valued storage nonvolatile memory according to a third embodiment of the present invention. FIG. 12 shows a case of a 4-value storing nonvolatile memory. Let the minimum threshold voltage distribution be called "1" and the maximum threshold voltage be called "4." Simultaneous writing and erasing tests are carried out between "1" and "4." This shortens the time required for the testing.

With the third embodiment, in a multi-valued memory, not limiting to the 4-value memory, the testing time can be shortened by rewriting the contents of memory cells from the minimum state to the maximum state or from the maximum state to the minimum state simultaneously.

(Fourth Embodiment)

Figure 13:
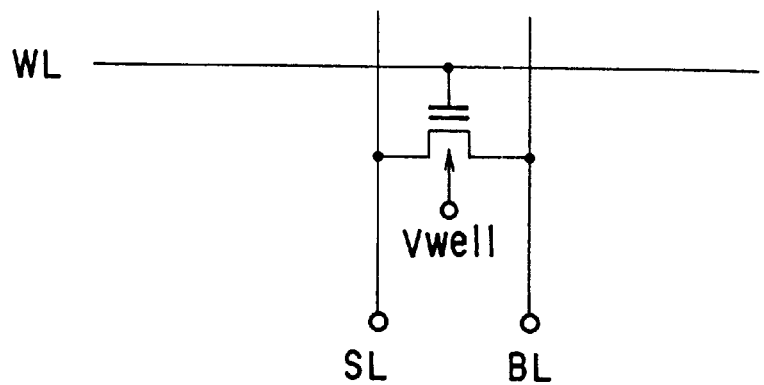
FIG. 13 is a circuit diagram of a memory cell in a nonvolatile semiconductor memory device according to a fourth embodiment of the present invention.

FIG. 13 is a circuit diagram of a memory cell in a nonvolatile semiconductor memory device according to a fourth embodiment of the present invention. The voltage conditions in the fourth embodiment are as follows:

WL→0V

SL→Floating

BL→Floating

Vwell→Vcc

Under these voltage conditions, the acceleration test of reading the data from memory cells whose threshold voltage is raised can be realized.

That is, in the nonvolatile semiconductor memory device that stores charges in the charge storage layer and memorizes information by giving a memory transistor more than one threshold voltage according to the amount of stored charges, the simultaneous acceleration test of reading the data from memory cells or the simultaneous acceleration test of holding the data can be realized.

(Fifth Embodiment)

Figure 14:
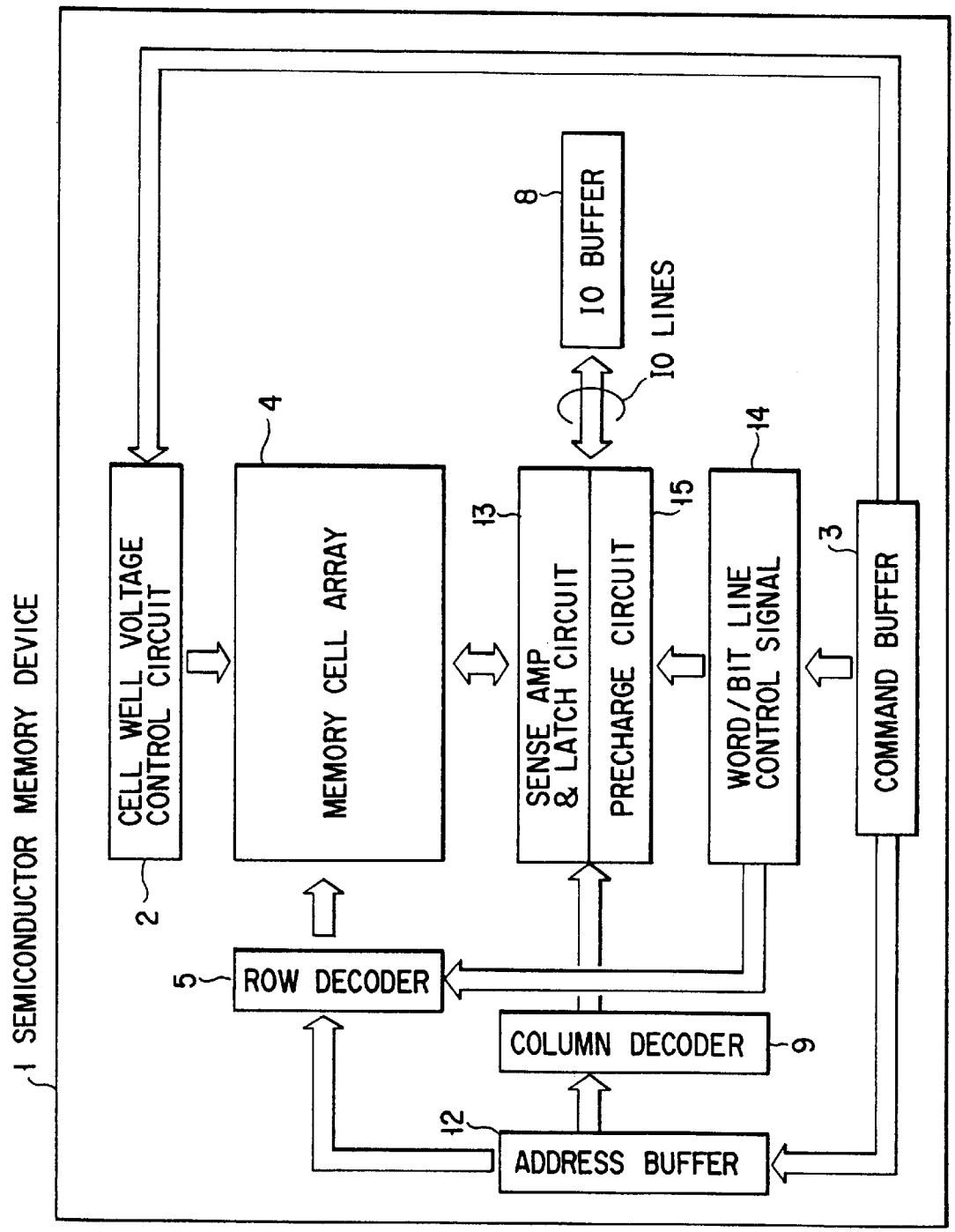
FIG. 14 is a block diagram of the basic structure of a semiconductor memory device according to a fifth embodiment of the present invention.

FIG. 14 is a block diagram of a semiconductor memory device according to a fifth embodiment of the present invention. In FIG. 14, the same parts as those in FIG. 1 are indicated by the same reference symbols.

A semiconductor memory device according to the fifth embodiment comprises: a memory cell array 4 where memory cells, which are selected by word lines and bitlines, are arranged in a matrix; a row decoder 5 that selects a word line and applies a specific voltage to a memory cell; a sense amplifier and latch circuit 13 that senses the bitline voltage corresponding to the data in a read operation and outputs the voltage corresponding to the writing data onto a bitline in a write operation; a word line/bitline control signal generator circuit 14 that supplies control signals to the word lines and bitlines; a precharge circuit 15 that outputs a voltage for preventing the data in memory cells from being changed to the bitlines selectively not connected to the sense amplifier and latch circuit 13 in writing the data in memory cells; an IO buffer 8 that exchanges the input data to be written into memory cells and the output data to be read from memory cells with circuitry outside the semiconductor memory device 1; a column decoder 9 that selects the sense amplifier and latch circuit 13 and connect it to an IO line; a command buffer 3 that generates commands including a write command and a read command; and an address buffer 12 that generates column addresses and row addresses according to the inputted address or the inputted test command.

In the case of a semiconductor memory device where a voltage must be applied to the well in a cell in a specific operation mode, a cell well voltage control circuit 2 is further provided.

Figure 15:
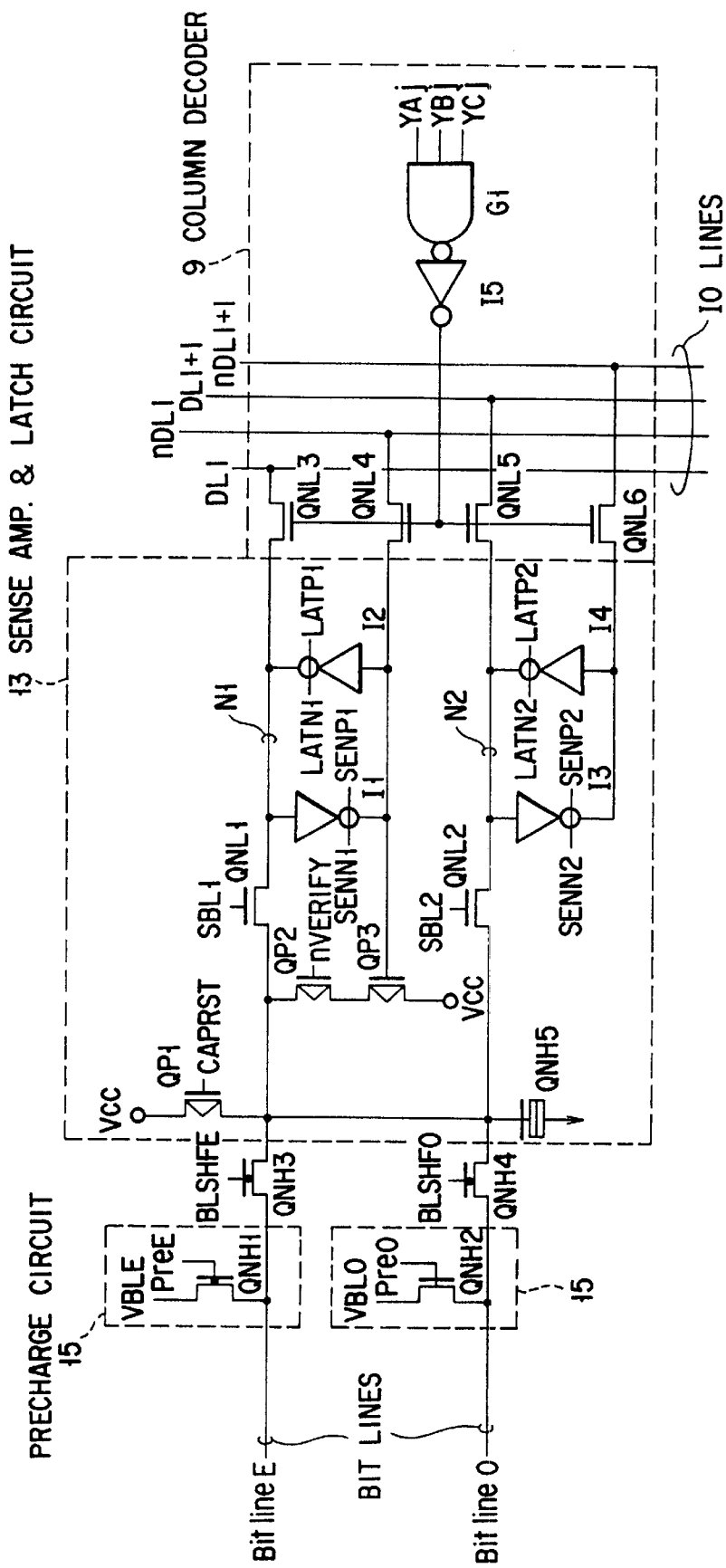
FIG. 15 is a circuit diagram of the peripheral circuitry ranging from the bitlines to the IO lines in the fifth embodiment.

FIG. 15 is a circuit diagram of the column decoder 9, sense amplifier and latch circuit 13, and precharge circuit 15, including the connection with the bitlines and IO lines, in the semiconductor memory device of the embodiment.

Explanation will be given using a nonvolatile semiconductor memory device including 3-value NAND flash memory cells.

Figures 16A, 16B, 16C:
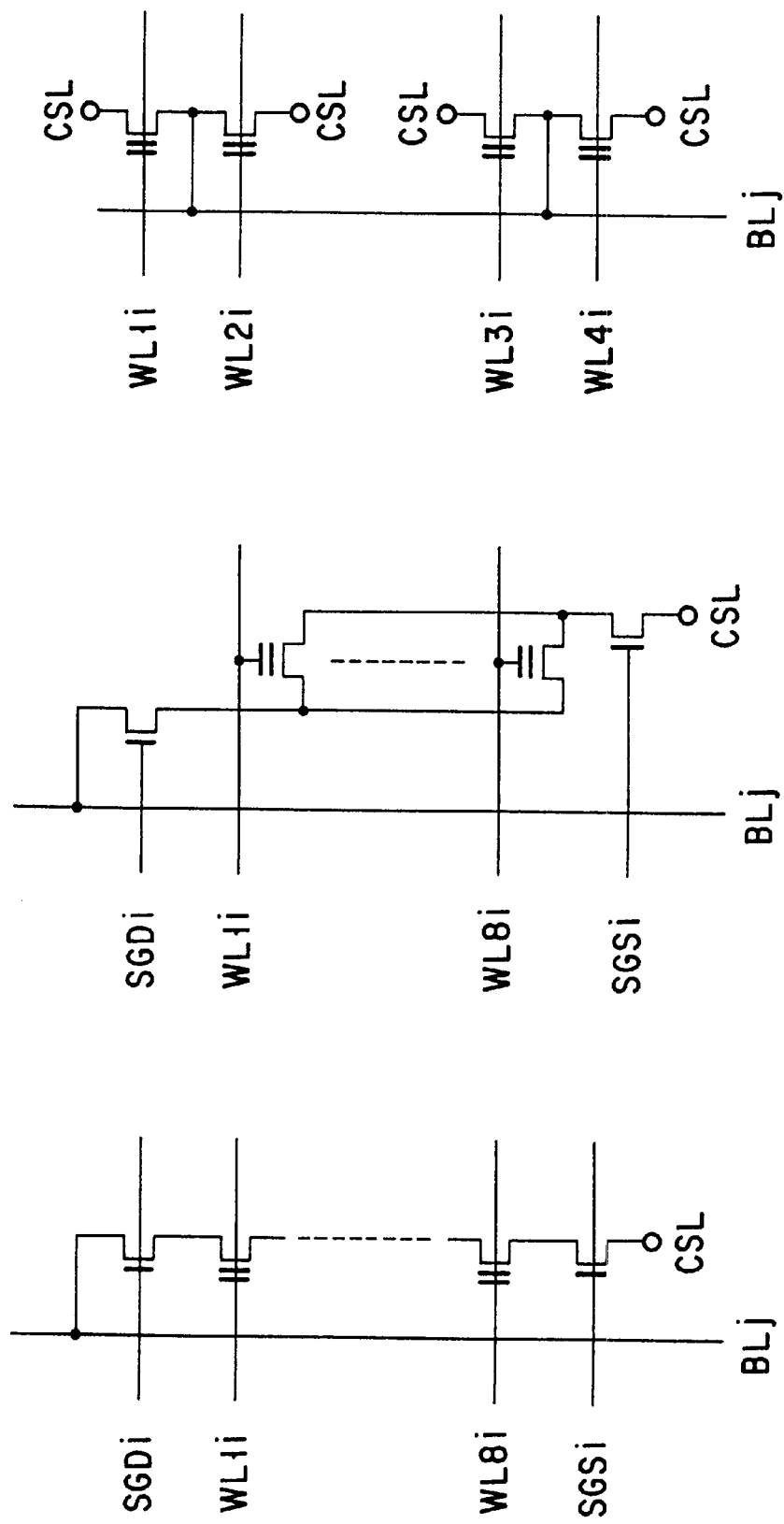
FIGS. 16A to 16C are circuit diagrams of a NAND multi-valued memory, an AND multi-valued memory, and a NOR multi-valued memory.
Figure 17A:
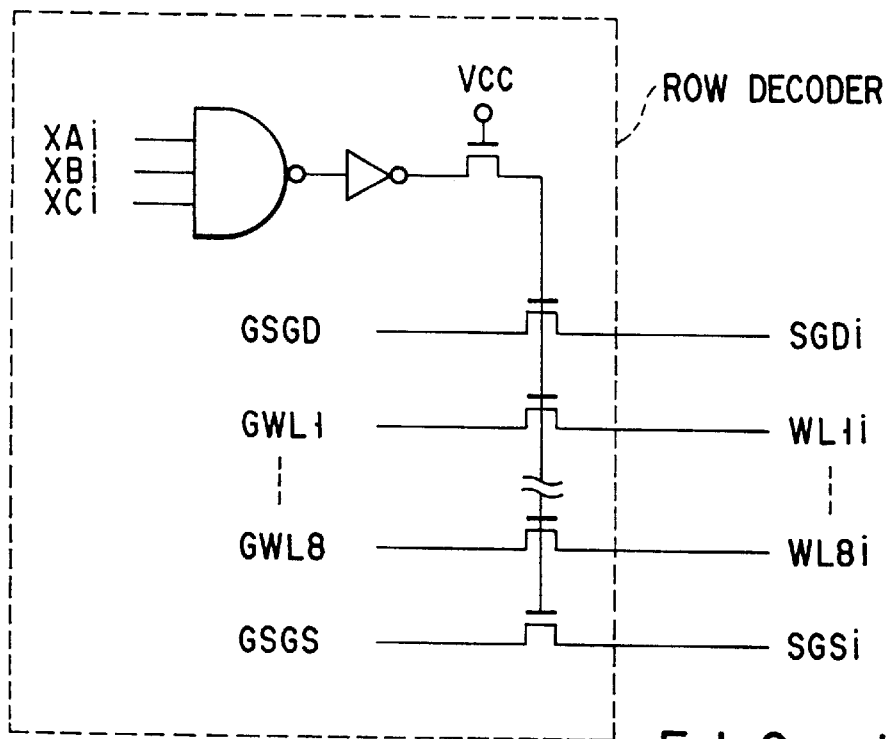
FIGS. 17A and 17B are circuit diagrams of row decoders.
Figure 17B:
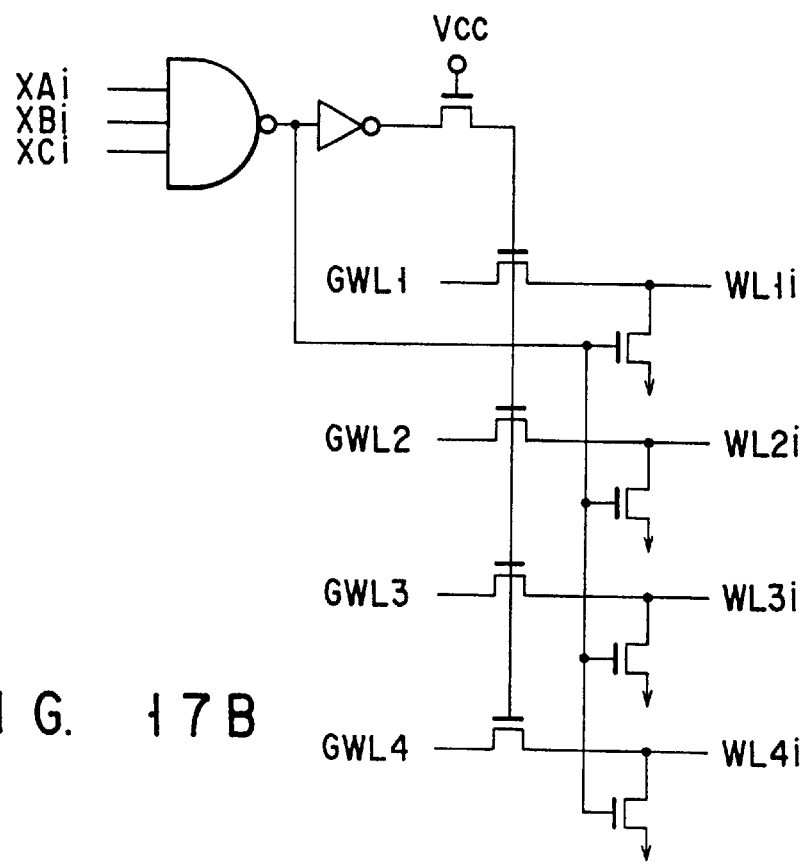

FIGS. 16A to 16C show the structure of various types of memory cell unit (FIG. 16A shows the structure of a NAND cell unit). FIGS. 17A and 17B show the structure of row decoders.

The 3-value sense amplifier and latch circuit 13 comprises a binary sense amplifier and latch circuit including inverters I1, I2 and a binary sense amplifier and latch circuit including inverters I3, I4. The precharge circuits 15 are connected to the bitlines in a one-to-one ratio. A single 3-value sense amplifier and latch circuit 13 is selectively connected by switches QNH3 and QNH4 to two bitlines Bitline E and Bitline O. Moreover, the 3-value sense amplifier and latch circuit 13 is connected by the column decoder 9 to an IO line. A memory cell's 3-value data items "0" to "2" and threshold voltages correspond to the latch data items N1 and N2 of the 3-value sense amplifier and latch circuit 13 as follows (Table):

TABLE

| 3-value | | Reading | | Writing | |
|---|---|---|---|---|---|
| Data | Threshold Voltage | N1 | N2 | N1 | N2 |
| "0" | Lower than 0 V | L | L | H | H |
| "1" | 1 V or higher 1.5 V or lower | H | L | L | H |
| "2" | 2 V or higher 2.5 V or lower | H | H | L | L |

Figure 18:
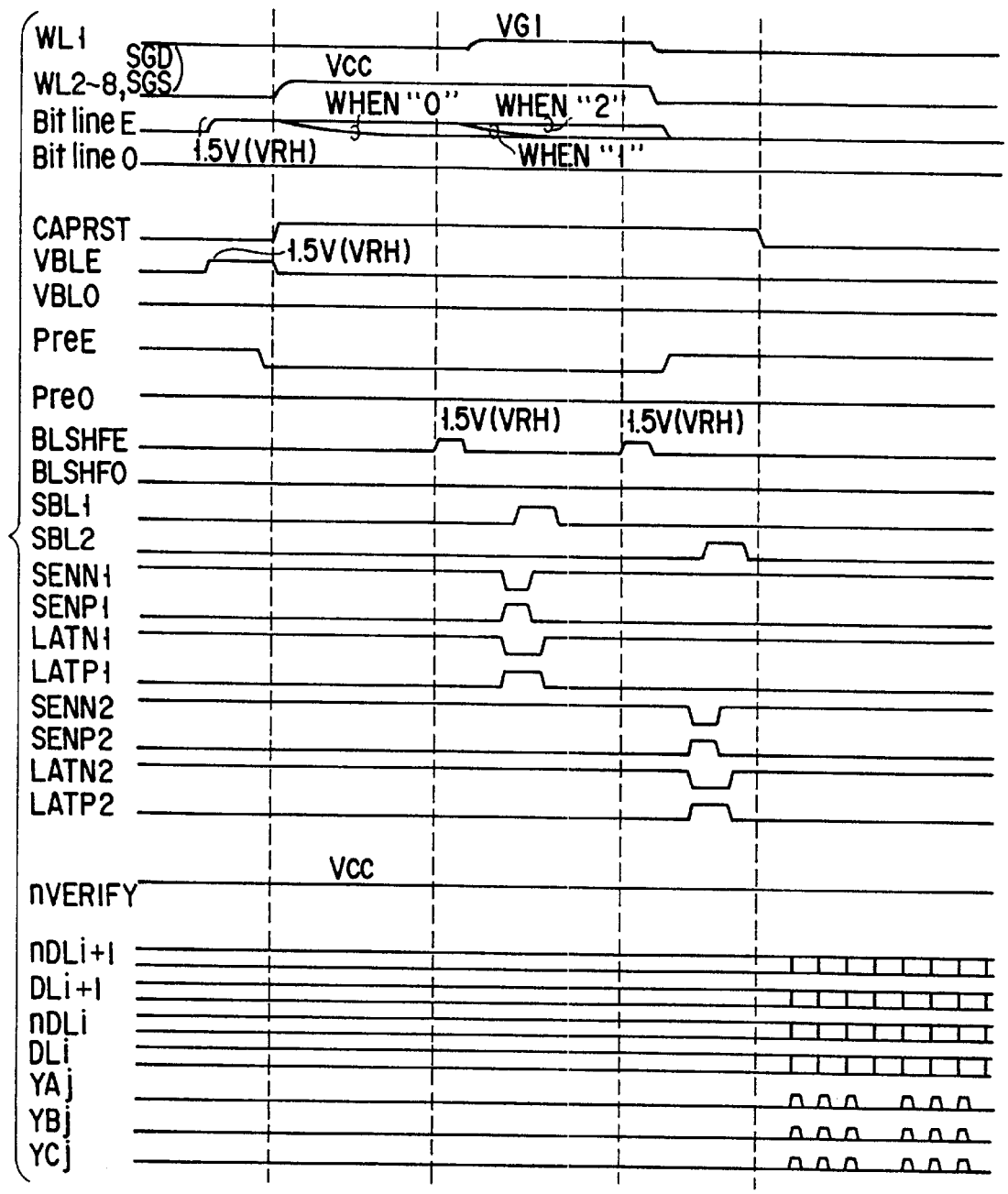
FIG. 18 is a waveform diagram of the operation of reading the data.

FIGS. 18 to 20 are waveform diagrams for explaining the operation of reading, writing, and erasing data. In the fifth embodiment, it is assumed that in a read operation and a write operation, Bitline E is selected and Bitline O is unselected.

First, a read operation will be explained by reference to FIG. 18. The selected bitline is charged to 1.5V and thereafter is brought into the floating state. Then, the unselected word lines WL2 to WL8 and selected gates SGS and SGD are set at the power supply voltage VCC. The selected word line is at 0V. When the data in the selected memory cell is "0," the bitline is discharged to 0V. When the data in the selected memory cell is not "0," the bitline remains at 1.5V.

The bitline voltage is read into the first binary sense amplifier in the presence of signal SBL1. Therefore, if the data is "0," node N1 will be at the low level. If the data is "1" or "2," node N1 will be at the high level. The selected word line is set at VG1 (=1.8v). If the data in the selected memory cell is "1," the bitline will be discharged to 0V. If the data in the selected memory cell is "2," the bitline will remain at 1.5V. If the data in the selected memory cell is "0," the bitline is already at 0V. The bitline voltage is read into the second binary sense amplifier in the presence of signal SBL2. Therefore, if the data is "0" or "1," node N2 will be at the low level. If the data is "2," the node N2 will be at the high level (see Table). The latched data is read onto the IO line serially.

Next, a write operation will be described by reference to FIG. 19. After the power supply has been turned on, when the voltage has reached a sufficient voltage at which the chip operates properly, power-on signal Pon goes high. The high power-on signal brings both of the latch data items N1, N2 in the 3-value sense amplifier and latch circuit 13 into the low level. When a command for inputting the writing data has arrived, the command signal is used to invert both of the latch data items N1, N2 to the high level.

The selected bitline is set at VCC, VD3–Vt (=1V), or 0V, depending on the writing data "0", "1", or "2." The voltage VCC is applied to the unselected bitlines to prevent the data from being changed. The selected gate SGD is set at VCC, SGS is set at 0V, the selected word line is set at VPP (=20V), and the unselected word lines are set at VM10 (=10V). For the voltages outputted from the sense amplifier and latch circuit onto the bitlines, 0V corresponds to the writing voltage and VCC corresponds to the unwriting voltage.

In the selected memory cell to whose bitlines 0V and 1V are applied, since the voltage between the gate and channel is high, a tunnel current flows, raising the threshold voltage of the memory cell. Because the 0-V bitline carries more tunnel current than the 1-V bitline, the threshold voltage becomes higher. Since the selected memory cell to which VCC is applied has a lower gate-channel voltage, no tunnel current flows, retaining "0."

Finally, an erase operation will be described by reference to FIG. 20. When an erase command is inputted, VPP (=20V) is applied to the well in the memory cell array 4. Because the gate of the selected memory cell is set at 0V, a tunnel current flows in the opposite direction to that in a write operation, making the threshold voltage of the memory cell lower. In contrast, because the gates of the unselected memory cells and selected transistor are brought into the floating state, the voltages of the gates, together with that of the well in the memory cell array 4, rise close to VPP. This prevents tunnel current from flowing, so that the threshold voltage remains unchanged.

Figure 21:
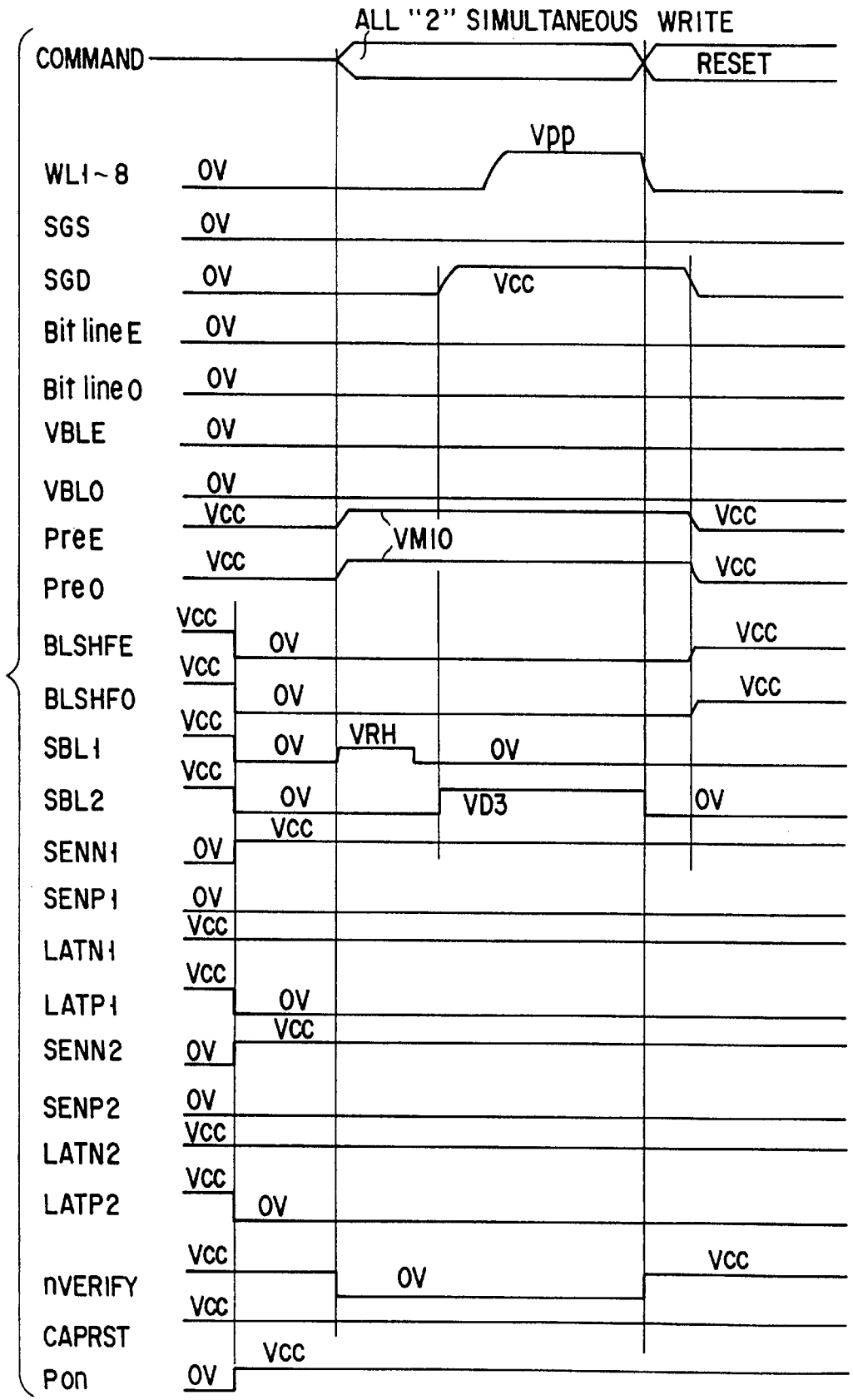
FIG. 21 is a waveform diagram pertaining to a method of testing the writing of the same data item into all memory cells, simultaneously.
Figure 22:
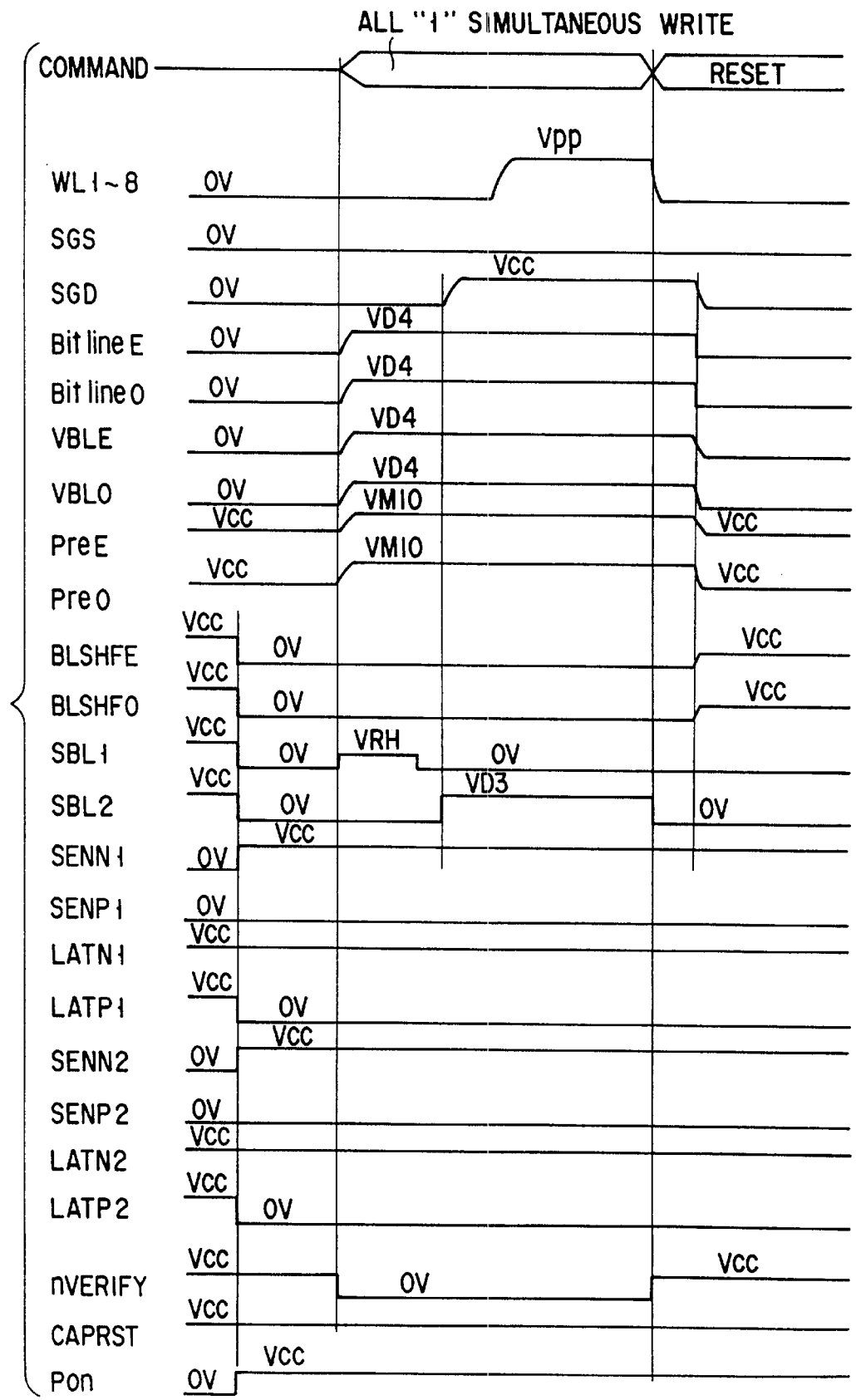
FIG. 22 is a waveform diagram pertaining to a method of testing the writing of the same data item into all memory cells, simultaneously.

FIGS. 21 to 23 are waveform diagrams for explaining a method of testing the simultaneous writing of the same data into all memory cells. FIGS. 21 to 23 are related to simultaneous writing "2" to "0". In the fifth embodiment, the sense amplifier and latch circuit 13 is disconnected from all of the bitlines and the precharge circuit 15 is connected to all of the bitlines. This makes it possible to simultaneously write the same data independent to the data latched in the sense amplifier and latch circuit 13.

When a simultaneous write command is inputted, signal BLSHFE(O) is made 0V and PreE(O) is made VM10, regardless of whether a bitline is selected or not, differently from a normal operation. In the case of ALL "2" simultaneous write, VBLE(O) is further made 0V. In the case of ALL "1" simultaneous write, VBLE(O) is further made VD4 (=1V). In the case of ALL "0" simultaneous write, VBLE(O) is further made VCC. Thereafter, all word lines are set at VPP, enabling the simultaneous writing of the same data. Similarly, column stripes 1 and 2 write can be realized in which different data items are written onto every other bitline (see FIGS. 24 and 25).

In the case of FIG. 24, "2" is written onto even-numbered bitlines and "0" is written onto odd-numbered bitlines. Namely, the writing voltage is outputted onto even-numbered bitlines and the unwriting voltage is outputted onto odd-numbered bitlines. In the case of FIG. 25, the opposite pattern is written.

In the fifth embodiment, with the sense amplifier and latch circuit 13 disconnected from the bitlines, connecting the precharge circuit 15 to all bitlines enables the data to be simultaneously written into the memory cells sharing the selected word line, even if the bitlines of the memory cells are different. That is, the data can be written simultaneously into the memory cells with more than one bitline, which shortens the testing time.

Moreover, as shown in FIGS. 24 and 25, the writing voltage is outputted onto even-numbered bitlines and the unwriting voltage is outputted onto odd-numbered bitlines so that a potential difference may develop between them, which makes it possible to carry out a stress test between bitlines at the same time.

Figure 26:
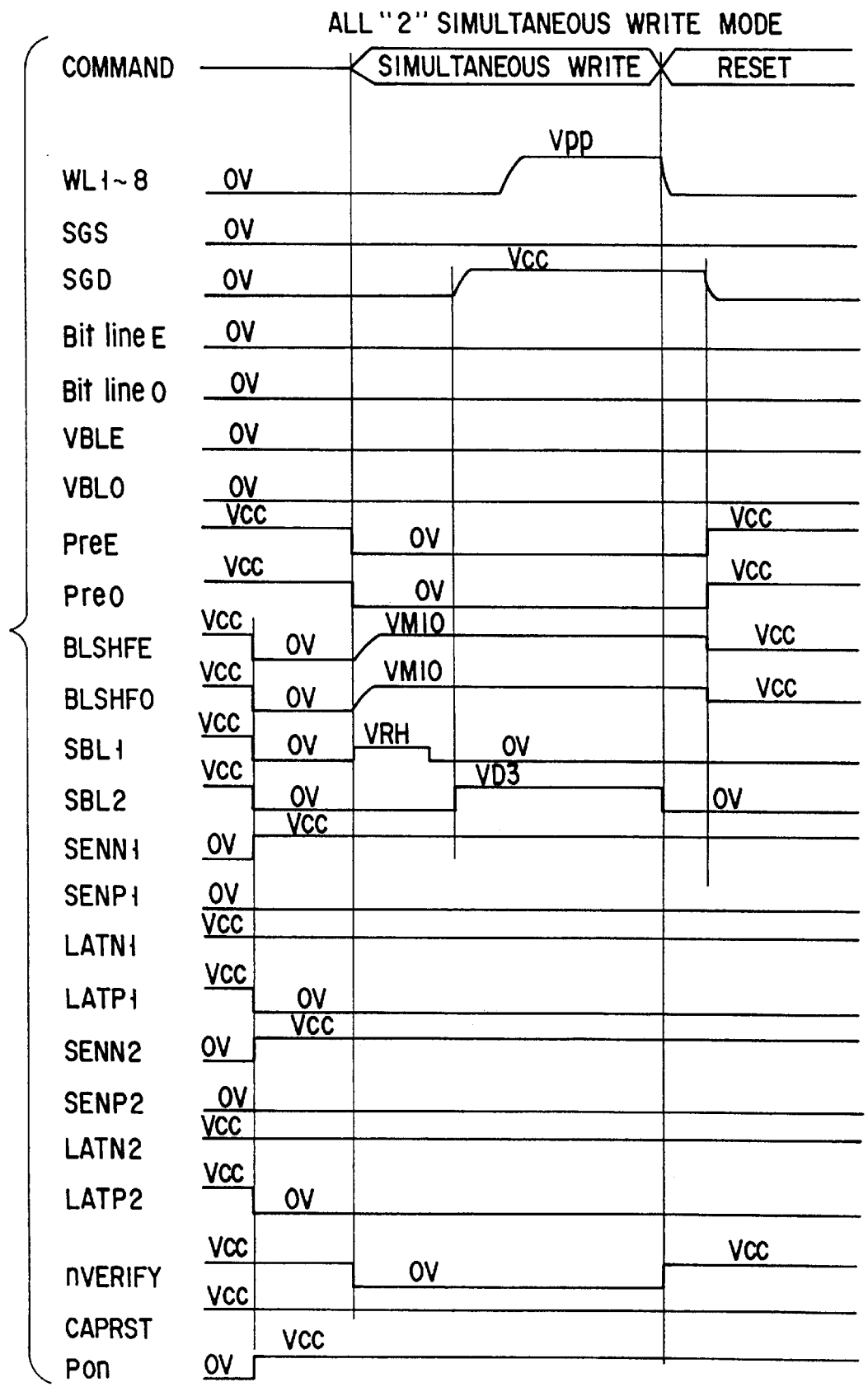
FIG. 26 is a waveform diagram pertaining to another method of testing the writing of the same data item into all memory cells, simultaneously.

FIGS. 26 to 28 are waveform diagrams to explain another method of testing the simultaneous writing of the same data into all memory cells. FIGS. 26 to 28 are related to simultaneous writing "2" to "0". In this embodiment, after the latched data in the sense amplifier and latch circuit 13 is made the same, the latch circuit 4 is connected to all bitlines and the precharge circuit is disconnected from all of the bitlines. This makes it possible to carry out a common command "simultaneous write" without the simultaneous write data. When this command is inputted, all word lines and both of the even-numbered bitlines and the odd-numbered bitlines are brought into the selected state.

In the case of ALL "2" simultaneous write (FIG. 26), because no serial data input command is inputted, the "2" writing data has been latched in all of the latch circuits. In this state, a simultaneous write operation is carried out, thereby writing "2" into all of the memory cells.

In the case of ALL "0" simultaneous write (FIG. 28), because a serial data input command is inputted, the "0" writing data has been latched in all of the latch circuits. In this state, a simultaneous write operation is carried out, thereby writing "0" into all of the memory cells. At this time, the writing data need not be inputted differently from the normal write mode.

In contrast, in the case of ALL "1" simultaneous write (FIG. 27), to latch ALL "1" writing data in the latch circuit, a "ALL "1" set" command is inputted. This inverts only latch data item N2, producing the "1" writing state. In this state, a simultaneous write operation is carried out, thereby writing "1" into all of the memory cells.

In this embodiment, with the precharge circuit 15 disconnected from the bitlines, connecting all bitlines to the sense amplifier and latch circuit 13 enables the data to be written into the memory cells sharing the selected word line, simultaneously, even if the bitlines of the memory cells are different. That is, the data can be written simultaneously into the memory cells with m ore than one bitline, which shortens the testing time.

Figure 29:
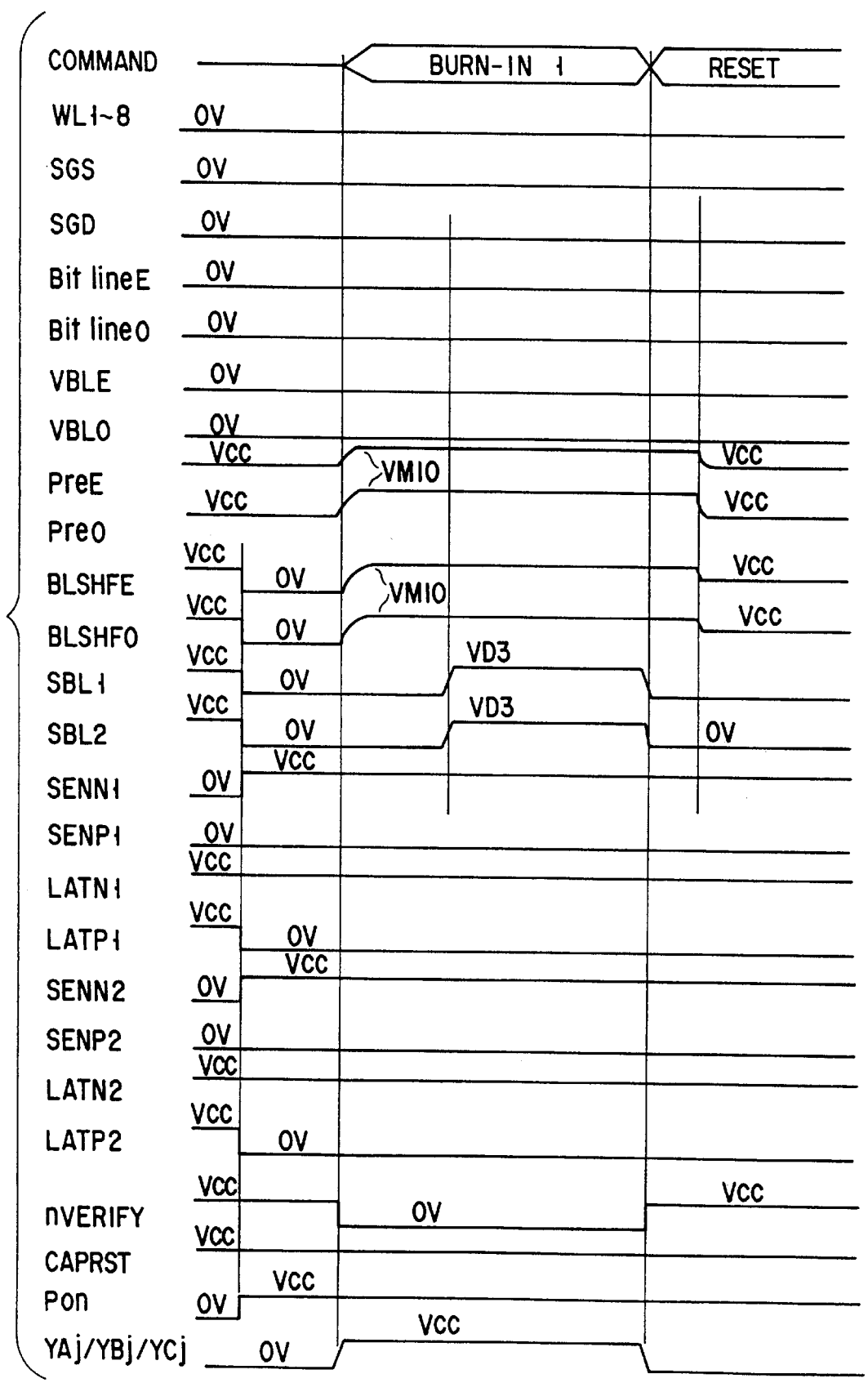
FIG. 29 is a burn-in operation waveform diagram.
Figure 33:
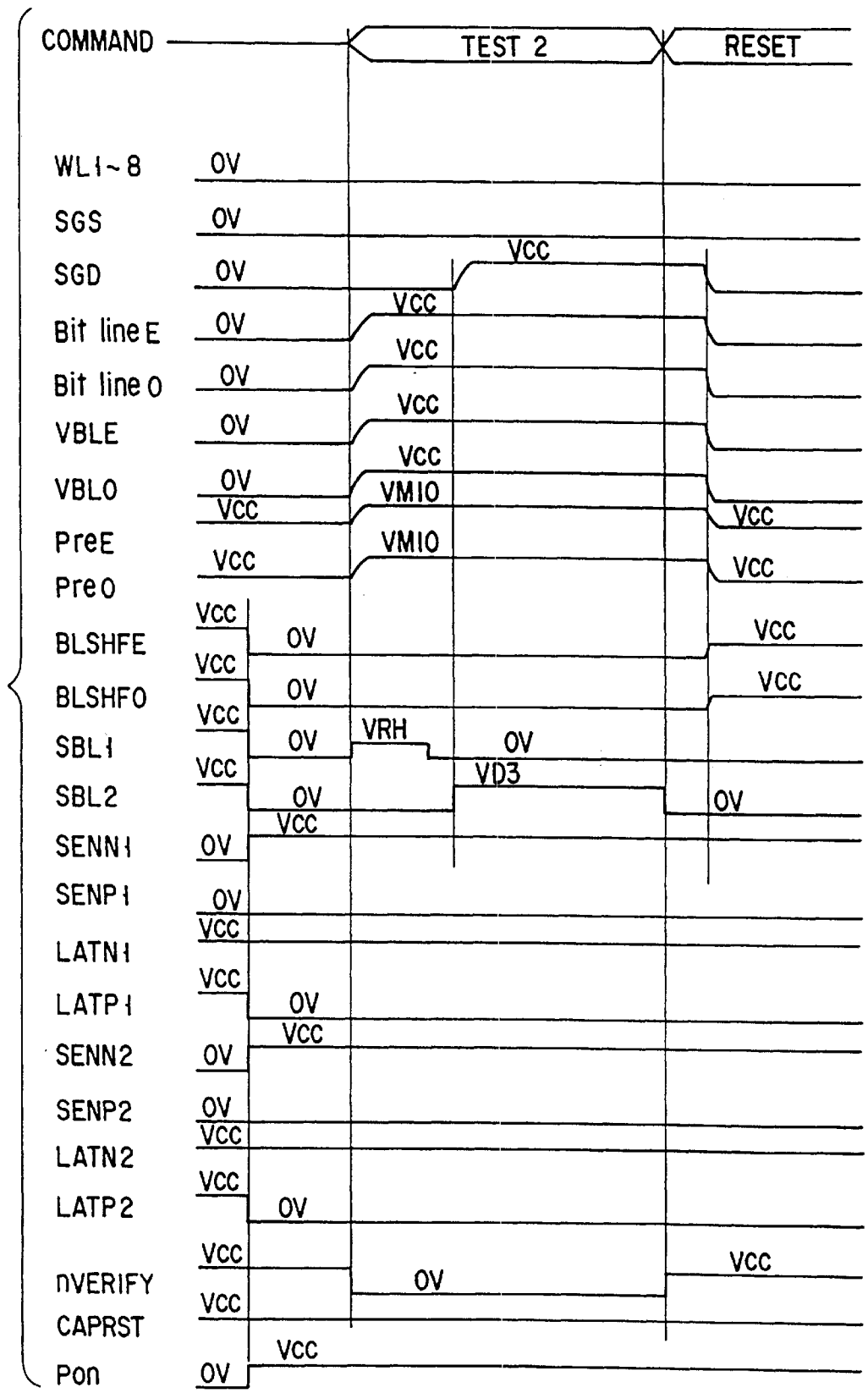
Figure 34:
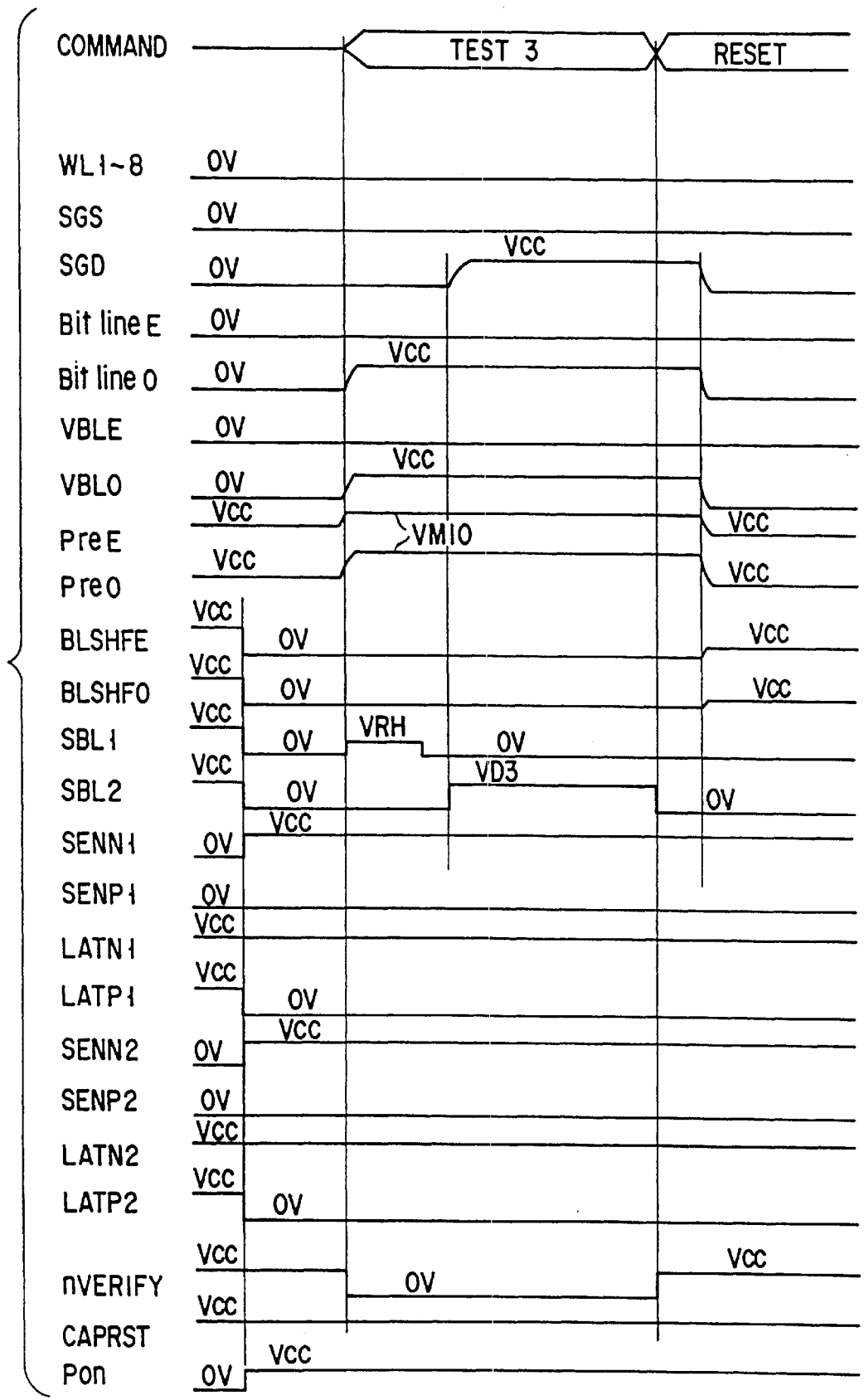
Figure 35:
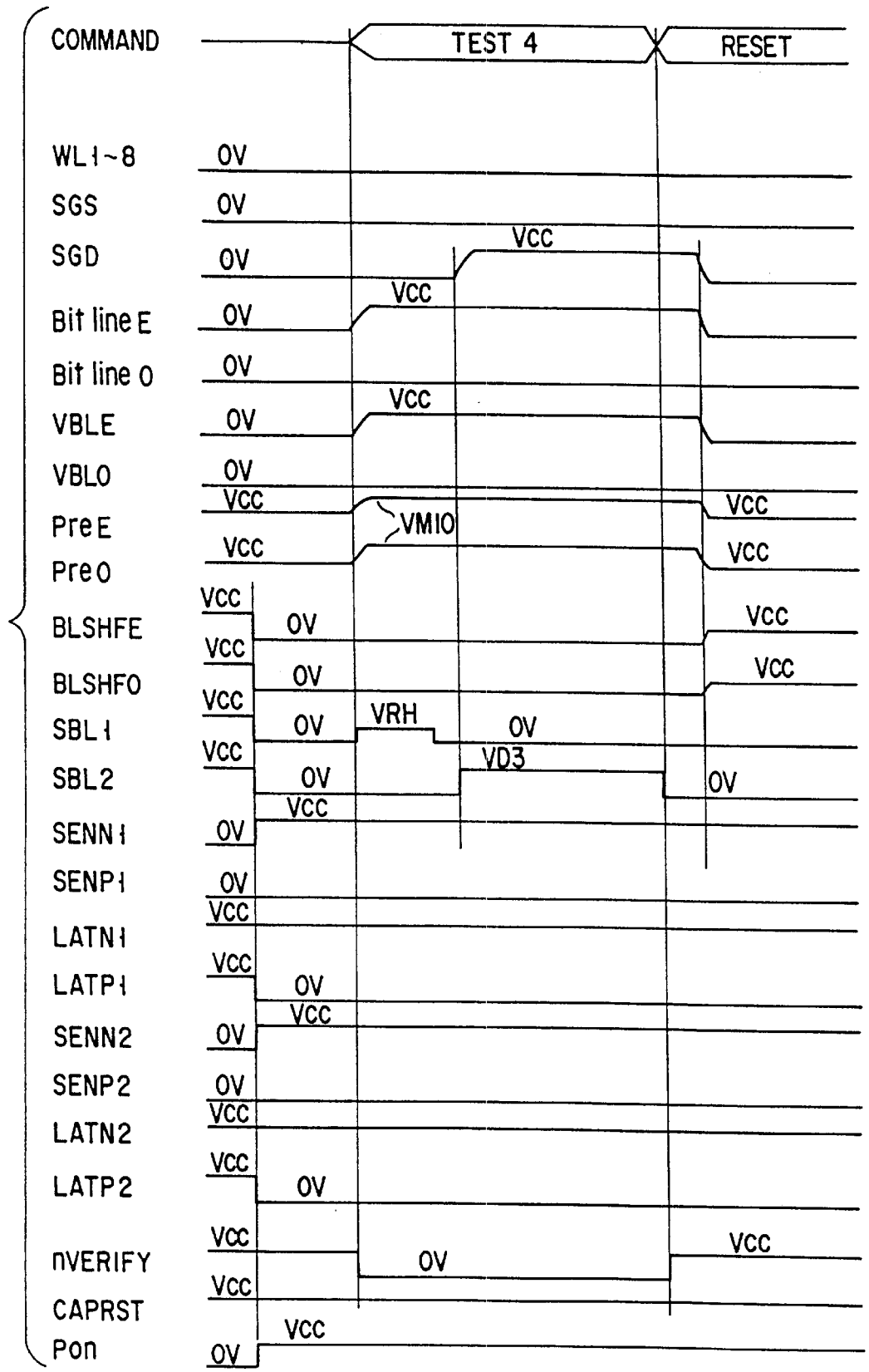

FIGS. 29 and 30 are burn-in operation waveform diagrams according to the present invention. Burn-in 1 is the operation of writing the data into memory cells by bringing all blocks and all bitlines into the selected state, setting all word lines and the selected gates at 0V, and bringing all sense amplifier and latch circuits into the "2" writing latch state, that is, latching the latch circuits so as to output the writing voltage onto bitlines. At the same time, the following conditions are set: VBLE(O)=0V, PreE(O)=VM10, and SBL1=VD3. Moreover, all of column addresses YAj, YBj, and YCj are brought into the selected state and more than one column decoder 9 is brought into the selected state, simultaneously.

Specifically, while the sense amplifier and latch circuits 13 are latched so as to output the writing voltage 0V and the precharge circuit 15 is caused to output 0V, these circuits are connected to bitlines. Therefore, in burn-in 1, it is possible to carry out a stress test on transistors QNH1 to QNH4, QNLt to QNL3, QNL5, and QP2 except for the memory cell section. At this time, instead of causing the precharge circuit 15 to output 0V, the voltages of the precharge circuit 15 and sense amplifier and latch circuit 13 may be kept at the same voltage via bitlines by causing an external circuit to bring the precharge circuit 15 into the floating state.

On the other hand, in burn-in 2, to apply stress to the transistors not tested in burn-in 1, the latch is inverted by a serial data input command, which latches all sense amplifier and latch circuits 13 so that the latch circuits may output the unwriting voltage onto the bitlines. All blocks are brought into the unselected state and all global word lines GWLx are set at VPP. All of column addresses YAj, YBj, and YCj are brought into the selected state and more than one column decoder 9 is brought into the selected state simultaneously.

Specifically, in this case, while the sense amplifier and latch circuits 13 are latched so as to output the unwriting voltage, the latch circuits are disconnected from the bitlines and CAPRST is made 0V, which makes it possible to carry out a stress test on QP1, QP3, QNH5, QNL4, and QNL6.

The serial data input command before burn-in 2 may not be inputted. This is because, for example, when burn-in 2 mode is tested repeatedly, the test of inputting a serial input command and the test of inputting no serial input command may be carried out for half of the repetitions of the burn-in 2 mode.

While burn-in 1 is followed by the test of burn-in 2, a stress test for the transistors except for the memory cell section may be carried out by directly latching the sense amplifier and latch circuits 13 so as to output the writing voltage onto the bitlines and disconnecting the latch circuit 4 from all of the bitlines.

FIGS. 32 to 35 show the other burn-in operation waveform diagrams.

FIGS. 32 to 35 differ from FIGS. 22 to 25 only in waveforms of WL1 to WL8.

In this embodiment, a voltage of 0V is successively applied to the gate of each the memory cell to test the transistors of the control circuit without applying voltage, in which this operation differs from a normal operation. In this operation, a relatively lower voltage, for example, about 10V, may be applied to the gate during the test operation, when a voltage of about 20V is required as a gate voltage to write data into each memory cell.

In FIGS. 32 to 35, it is possible to carry out the test by fixing SGD to 0V in addition to the above condition. When the test is carried out with above condition, a difference of the voltage between the gate and channel of the transfer transistors (QN11 to QN14 in FIG. 2) of the row decoder shown in FIGS. 2 and 17 can become larger than in the normal opeartion, thereby these transistors can be effectively tested.

When a similar test is carried out by disconnecting the precharge circuit to all of the bitlines and connecting the sense amplifier and latch circuit to all of the bitlines, it is effective a voltage applied to the gate of each memory cell is set to 0V as described above.

Although the embodiment using 3-value NAND flash memory cells has been explained, the present invention is not limited to this, but may be applied to binary memories or multi-valued memories. Furthermore, the present invention is not restricted to NAND memories, but may be applied to AND flash memories shown in FIG. 16B or NOR flash memories shown in FIG. 16C. Moreover, the present invention is not limited to nonvolatile memories, but may be applied to a DRAM as shown in FIG. 31A or an SRAM as shown in FIG. 31B.

The present invention may be practiced or embodied in still other ways without departing from the spirit or essential character thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
    a memory cell array having a plurality of memory cells arranged at intersections of a plurality of bitlines and a plurality of word lines;
    a sense amplifier and latch circuit that is selectively connected to said plurality of bitlines and senses the bitline voltage corresponding to a data in reading the data in said plurality of memory cells and outputs the voltage corresponding to the writing data onto said plurality of selected bitlines in writing the data into said plurality of memory cells;
    a precharge circuit that is selectively connected to said plurality of bitlines and outputs a voltage for preventing the change of the data in memory cells onto the bitlines unconnected to the sense amplifier and latch circuit in writing the data into a memory cell; and
    a control circuit for disconnecting said sense amplifier and latch circuit from all of said plurality of bitlines, connecting said precharge circuit to all of said plurality of bitlines, outputting at least one of a writing voltage and an unwriting voltage onto all of said plurality of bitlines, and simultaneously writing the data into a plurality of memory cells sharing the selected word line.

2. A semiconductor memory device according to claim 1, wherein a writing voltage is applied to said plurality of word lines in said simultaneously writing.

3. A semiconductor memory device according to claim 1, wherein said control circuit further disconnects said sense amplifier and latch circuit from all of said plurality of bitlines, connects said precharge circuit to all of said plurality of bitlines, and outputs at least one of a writing voltage and an unwriting voltage onto all of said plurality of bitlines, while all of said plurality of word lines are prevented from being applied a writing voltage thereto.

4. A semiconductor memory device according to claim 1, wherein said memory cells are capable of storing n-levels (n≧3).

5. A semiconductor memory device comprising:
    a memory cell array having a plurality of memory cells arranged at intersections of a plurality of bitlines and a plurality of word lines;

a sense amplifier and latch circuit that is selectively connected to said plurality of bitlines and senses the bitline voltage corresponding to a data in reading the data in said plurality of memory cells and outputs the voltage corresponding to the writing data onto said plurality of selected bitlines in writing the data into said plurality of memory cells;

a precharge circuit that is selectively connected to said plurality of bitlines and outputs a voltage for preventing the change of the data in memory cells onto the bitlines unconnected to the sense amplifier and latch circuit in writing the data into a memory cell; and a control circuit for disconnecting said sense amplifier and latch circuit from all of said plurality of bitlines, connecting said precharge circuit to all of said plurality of bitlines, outputting a writing voltage onto one of two adjacent bitlines and an unwriting voltage onto the other of the two adjacent bitlines, and simultaneously writing the data into a plurality of memory cells sharing the selected word line.

6. A semiconductor memory device according to claim 5, wherein a writing voltage is applied to said plurality of word lines in said simultaneously writing.

7. A semiconductor memory device according to claim 5, wherein said control circuit further disconnects said sense amplifier and latch circuit from all of said plurality of bitlines, connects said precharge circuit to all of said plurality of bitlines, and outputs a writing voltage onto one of two adjacent bitlines and an unwriting voltage onto the other of the two adjacent bitlines, while all of said plurality of word lines are prevented from being applied a writing voltage thereto.

8. A semiconductor memory device according to claim 5, wherein said memory cells are capable of storing n-levels (n≧3).

9. A semiconductor memory device comprising:

memory cell array having a plurality of memory cells arranged at intersections of a plurality of bitlines and a plurality of word lines;

a sense amplifier and latch circuit that is selectively connected to said plurality of bitlines and senses the bitline voltage corresponding to a data in reading the data in a memory cell and outputs the voltage corresponding to the writing data onto a bitline in writing the data in a memory cell;

a precharge circuit that is selectively connected to said plurality of bitlines and outputs a voltage for preventing the change of the data in memory cells onto said plurality of bitlines unconnected to the sense amplifier and latch circuit in writing the data into a memory cell; and a control circuit for disconnecting said precharge circuit from said plurality of bitlines, connecting said sense amplifier and latch circuit to said plurality of bitlines, and simultaneously writing the same data into a plurality of memory cells sharing the selected word line.

10. A semiconductor memory device according to claim 9, wherein a writing voltage is applied to said plurality of word lines in said simultaneously writing.

11. A semiconductor memory device according to claim 9, wherein said control circuit further disconnects said precharge circuit from said plurality of bitlines, and connects said sense amplifier and latch circuit to said plurality of bitlines, while all of said plurality of word lines are prevented from being applied a writing voltage thereto.

12. A semiconductor memory device according to claim 9, wherein said memory cells are capable of storing n-levels (n≧3).

13. A semiconductor memory device comprising:

a memory cell array having a plurality of memory cells arranged at intersections of a plurality of bitlines and a plurality of word lines;

a sense amplifier and latch circuit that is selectively connected to said plurality of bitlines and senses the bitline voltage corresponding to a data in reading the data in said plurality of memory cells and outputs the voltage corresponding to the writing data onto said plurality of selected bitlines in writing the data into said plurality of memory cells;

a precharge circuit that is selectively connected to said plurality of bitlines and outputs a voltage for preventing the change of the data in memory cells onto the bitlines unconnected to the sense amplifier and latch circuit in writing the data into a memory cell; and a control circuit for latching said sense amplifier and latch circuit so as to output a writing voltage and an unwriting voltage respectively onto said plurality of bitlines and disconnecting said sense amplifier and latch circuit from all of the bitlines.

14. A semiconductor memory device according to claim 13, wherein said memory cells are capable of storing n-levels (n≧3).

* * * * *